US012073900B2

(12) United States Patent
Okuda

(10) Patent No.: US 12,073,900 B2
(45) Date of Patent: Aug. 27, 2024

(54) SEMICONDUCTOR MEMORY DEVICE AND TEST METHOD FOR THE SAME

(71) Applicant: RENESAS ELECTRONICS CORPORATION, Tokyo (JP)

(72) Inventor: Haruyuki Okuda, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 190 days.

(21) Appl. No.: 17/900,228

(22) Filed: Aug. 31, 2022

(65) Prior Publication Data

US 2023/0115776 A1 Apr. 13, 2023

(30) Foreign Application Priority Data

Oct. 8, 2021 (JP) .............................. JP2021-165848

(51) Int. Cl.
*G11C 29/12* (2006.01)
*G11C 11/418* (2006.01)
(52) U.S. Cl.
CPC ...... *G11C 29/12005* (2013.01); *G11C 11/418* (2013.01); *G11C 2029/1202* (2013.01)
(58) Field of Classification Search
CPC ............ G11C 29/12005; G11C 11/418; G11C 2029/1202; G11C 8/08; G11C 11/419; G11C 29/06
See application file for complete search history.

(56) References Cited

U.S. PATENT DOCUMENTS 6,741,510 B2    5/2004  Ohbayashi et al.
2002/0034112 A1*  3/2002  Kato ....................... G11C 29/46
                                                          365/201
2006/0050599 A1*  3/2006  Chou ............... G11C 29/12005
                                                          365/232

FOREIGN PATENT DOCUMENTS

JP          2003-249099 A       9/2003

* cited by examiner

*Primary Examiner* — Jerome Leboeuf
(74) *Attorney, Agent, or Firm* — Rimon P.C.

(57) ABSTRACT

A semiconductor device includes memory cells, word lines, a row address decoder, word line drivers, a first switch transistor, and second switch transistors. The switch transistor is provided between the word line drivers and a power supply potential terminal. Each second switch transistor is provided between each word line and a reference potential terminal. The row address decoder activates all of decode signals corresponding to the memory cells to which a burn-in test is performed collectively. The first switch transistor has a lower driving capability than a total driving capability of two P-channel MOS transistors included in inverters of two word line drivers. Each second switch transistor has a lower driving capability than a driving capability of an N-channel MOS transistor included in the inverter of each word line driver.

17 Claims, 15 Drawing Sheets

SEMICONDUCTOR MEMORY DEVICE AND TEST METHOD FOR THE SAME

CROSS-REFERENCE TO RELATED APPLICATIONS

The disclosure of Japanese Patent Application No. 2021-165848 filed on Oct. 8, 2021, including the specification, drawings and abstract is incorporated herein by reference in its entirety.

BACKGROUND

The present invention relates to a semiconductor memory device and a test method thereof, and, for example, to a semiconductor memory device which is suitable for performing a highly reliable test and a test method thereof.

The Background of the Invention

In a semiconductor memory device, before being shipped as a product, for example, at the stage of a wafer, a burn-in test is performed by applying a stress of high temperature or high potential to the internal circuit. Incidentally, the burn-in test performed at the stage of the wafer is also referred to as a wafer level burn-in test.

There is a disclosed technique listed below.
[Patent Document 1] Japanese Unexamined Patent Application Publication No. 2003-249099

A document related to a burn-in test of a semiconductor memory device is disclosed in, for example, Patent Document 1.

The semiconductor memory device disclosed in Patent Document 1 includes a memory cell array, and a test circuit that continuously applies a plurality of stresses to the memory cell array in response to a request to shift to the burn-in test mode. Here, in this semiconductor memory device, during a burn-in test, the word lines of a plurality rows are simultaneously activated and stress is simultaneously applied to the memory cells of the plurality of rows, whereby shortening the test time.

SUMMARY

Here, in the configuration of the Static Random Access Memory (SRAM) shown in Patent Document 1, in order to prevent the through current from flowing, data of the same value must be written in advance in a plurality of memory cells that are accessed simultaneously during the burn-in test.

However, in the configuration of Patent Document 1, the voltage drop of the power supply potential line and the voltage rise (floating) of the reference potential line will occur by simultaneous access to a plurality of memory cells at the time of burn-in test, and as a result, the value of the data stored in some memory cells may be inverted unintentionally. In this case, since a through current flows between a plurality of memory cells in which data having different values are written, there is a possibility that a desired stress is not applied to a plurality of memory cells to be tested. In other words, in the configuration of Patent Document 1, there has been a problem that a highly reliable test cannot be performed. Other objects and novel features will be apparent from the description of this specification and the accompanying drawings.

A semiconductor memory device according to one embodiment operates in an operation mode including a normal operation mode and a test mode. The semiconductor device includes a plurality of memory cells which is arranged in a matrix, a plurality of word lines which is coupled to the plurality of memory cells, a row address recorder which outputs a plurality of decode signals, a plurality of word line drivers which drives the plurality of word lines in response to the plurality of decode signals, a power supply potential terminal to which a power supply potential is supplied, a reference potential terminal to which a reference potential is supplied, a first switch transistor which is provided between the plurality of word line drivers and the power supply potential terminal, and whose conduction state is controlled in accordance with the operation mode, and a plurality of second switch transistors whose conduction state is controlled in accordance with the operation mode. Each of the plurality of word lines is wired for each row of the plurality of memory cells. Each of the plurality of decode signals is output corresponding to each of the plurality of word lines. Each of the plurality of word line drivers is coupled to each of the plurality of word lines, drives each of the plurality of word lines in response to each of the plurality of decode signals, and includes an inverter that is configured by a P-channel Metal Oxide Semiconductor (MOS) transistor and an N-channel MOS transistor. The first switch transistor is a P-channel MOS transistor. Each of the plurality of second switch transistors is provided between each of the plurality of word lines and the reference potential terminal and is an N-channel MOS transistor. The row address decoder activates all of decode signals corresponding to the plurality of memory cells to which a burn-in test is performed collectively in the mode. The first switch transistor has a lower driving capability than a total driving capability of two P-channel. MOS transistors included in the inverters of two word line drivers among the plurality of the word line drivers. Each of the plurality of second switch transistors has a lower driving capability than a driving capability of the N-channel MOS transistor included in the inverter of each of the plurality of word line drivers.

The present disclosure can provide a semiconductor memory device suitable for performing a highly reliable test.

DETAILED DESCRIPTION

Figure 1:
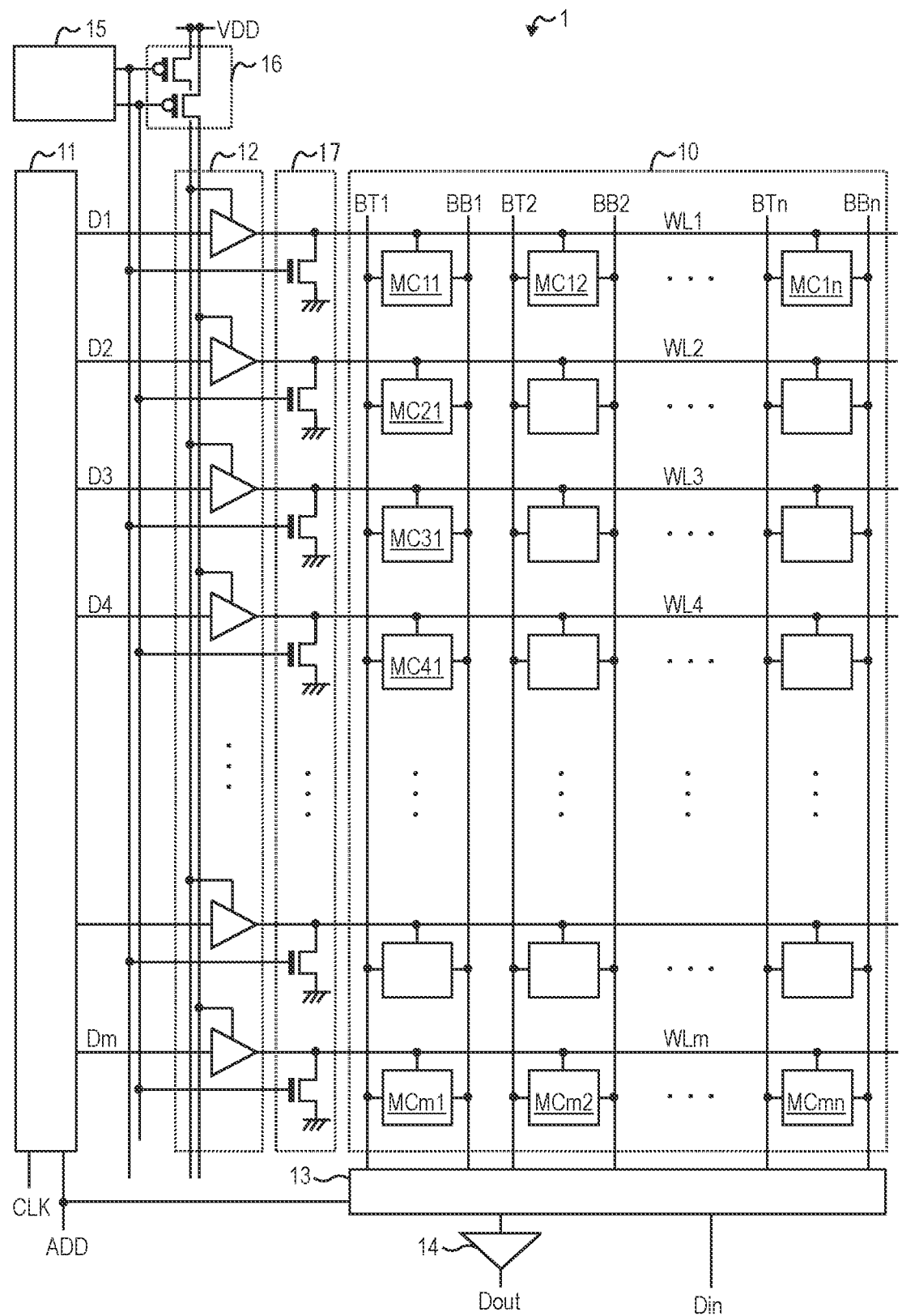
FIG. 1 is a block diagram showing a configuration example of a semiconductor memory device according to a first embodiment.

Embodiments will be described below with reference to the drawings. Since the drawings are simplified, the technical scope of the embodiments should not be construed narrowly on the basis of the description of the drawings. The same elements are denoted by the same reference numerals, and a repetitive description thereof is omitted.

In the following embodiments, if necessary for convenience, the description will be divided into a plurality of sections or embodiments. Except where expressly stated, however, they are not independent of each other, and one is related to the modified example, detailed description, supplementary description, or the like of part or all of the other. Further, in the following embodiments, when the number of elements etc. (including the number, numerical value, quantity, range, etc.) is referred to, except the case where it is specified in particular or the case where it is obviously limited to the specific number in principle, the number is not limited to the sped number, and may be more than or less than the specific number.

Furthermore, in the following embodiments, it is needless to say that the constituent elements (including element steps and the like) are not necessarily essential except in the case where they are specifically specified and the case where they are considered to be obviously essential in principle. Similarly, in the following embodiments, when referring to the shapes, positional relationships, and the like of components and the like, it is assumed that the shapes and the like are substantially approximate to or similar to the shapes and the like, except for the case in which they are specifically specified and the case in which they are considered to be obvious in principle, and the like. The same applies to the above-mentioned numbers and the like (including the number, numerical value, quantity, and range).

First Embodiment

FIG. 1 is a block diagram showing a configuration example of a semiconductor memory device 1 according to a first embodiment. The semiconductor memory device 1 is an SRAM, and when a burn-in test for the semiconductor memory device 1 is performed, word lines of a plurality of rows are simultaneously activated and a desired stress is simultaneously applied to the memory cells of the plurality of rows, whereby shortening the test time. Further, in the semiconductor memory device 1, by simultaneously activating or deactivating the word line of a plurality of rows at a slew rate lower than that the normal operation, the voltage drop of the power supply potential line and the voltage rise (floating) of the reference potential line are suppressed, and the burn-in test with high reliability can be performed. Hereafter, a concrete description will be given.

As shown in FIG. 1, the semiconductor memory device 1 includes at least a memory cell array 10, a row address decoder 11, a word line driver group 12, a selection circuit 13, a sense amplifier 14, a mode switching circuit 15, a switch circuit 16, and a switch circuit group 17. The memory cell array 10 is configured by a plurality of memory cells MC11 to MCmn arranged in a matrix of m (m is an integer greater than or equal to 2) rows×n (n is an integer greater than or equal to 2) columns.

The mode switching circuit 15 switches the operation mode of the semiconductor memory device 1. Specifically, the mode switching circuit 15 switches the operation mode of the semiconductor memory device 1 to either a normal operation mode in which normal operation is performed in the semiconductor memory device 1 or a test mode which a burn-in test is performed in the semiconductor memory device 1 by controlling the on/off states of the switch circuit 16 and the m switch circuits constituting the switch circuit group 17, respectively.

In the example of FIG. 1, a case where the operation mode of the semiconductor memory device 1 is set to the normal operation mode will be described. Although described in detail later, in the normal operation mode, the switch circuit 16 is controlled to be in an on state, and all m switch circuits constituting the switch circuit group 17 are controlled to be in an off state.

The row address decoder 11 decodes the address signal ADD and outputs m decode signals D1 to Dm. The word line driver group 12 is configured by m word line drivers (also referred to as word line drivers 12_1 to 12_m), drives the decode signals D1 to Dm, and outputs the decode signals D1 to Dm to word lines WL1 to WLm. Hereinafter, the signals propagating to the word lines WL1 to WLm are also referred to as word line signals WL1 to WLm.

In the normal operation mode, the row address decoder 11 activates the decode signal Di (i is an integer from 1 to m) of to the i-th row specified by the address signal ADD in synchronization with the rising edge of the clock signal CLK. Here, the activation of the decode signal Di by the row address decoder 11 means to set the decode signal Di to L level, and the deactivation of the decode signal Di by the row address decoder 11 means to set the decode signal Di to H level. Accordingly, the word line WLi of the i-th row specified by the address signal ADD is activated, i.e., indicates H level. As a result, the n memory cells MCi1 to MCin in the i-th row provided corresponding to the activated word line WLi are connected to the m sets of bit lines BT1 and BB1 to BTn and BBn, respectively. The selection circuit 13 selects the bit lines BTj and BBj (j is an integer from 1 to n) of the j-th column specified by the address signal ADD among the m sets of bit lines BT1 and BB1 to BTn and BBn.

At the time of data reading, the data stored in the n memory cells MCi1 to MCin of the i-th row provided corresponding to the activated word line WLi propagates to the m sets of bit lines BT1 and BB1 to BTn and BBn. The selection circuit 13 selects the data of the bit lines BTj and BBj of the j-th column specified by the address signal ADD among the data of the m sets of bit lines BT1 and BB1 to BTn and BBn. Then, the sense amplifier 14 amplifies the data of the bit lines BTj and BBj selected by the selection circuit 13, and outputs it to the outside as a read data Dout.

On the other hand, at the time of data writing, write data Din from the outside is input to the selection circuit 13. At this time, the write data Din propagates to the bit lines BTj and BBj of the j-th column specified by the address signal ADD among the m sets of bit lines BT1 and BB1 to BTn and BBn, and then the write data Din is written to the memory cell MCij of the i-th row specified by the address signal ADD.

Next, a more specific configuration of the semiconductor memory device 1 will be described with reference to FIG. 2 and FIG. 3. Here, in the semiconductor memory device during the burn-in test, the word lines of a plurality of rows are simultaneously activated and a desired stress is simultaneously applied to the memory cells of the plurality of rows, thereby the test can be shortened. In the present embodiment, at first the semiconductor memory device 1 collectively performs a burn-in test on a plurality of memory cells of odd-numbered rows by simultaneously activating a plurality of word lines of the odd-numbered rows and simultaneously applying a stress to the plurality of memory cells of the odd-numbered rows. Subsequently, the semiconductor memory device 1 collectively performs a burn-in test on a plurality of memory cells of even-numbered rows by simultaneously activating a plurality of word lines of the even-numbered rows and simultaneously applying a stress to the plurality of memory cells of the even-numbered rows. Therefore, in the following, the plurality of memory cells of the odd-numbered rows and peripheral circuits thereof will be described separately from the plurality memory cells of the even-numbered rows and peripheral circuits thereof.

Figure 2:
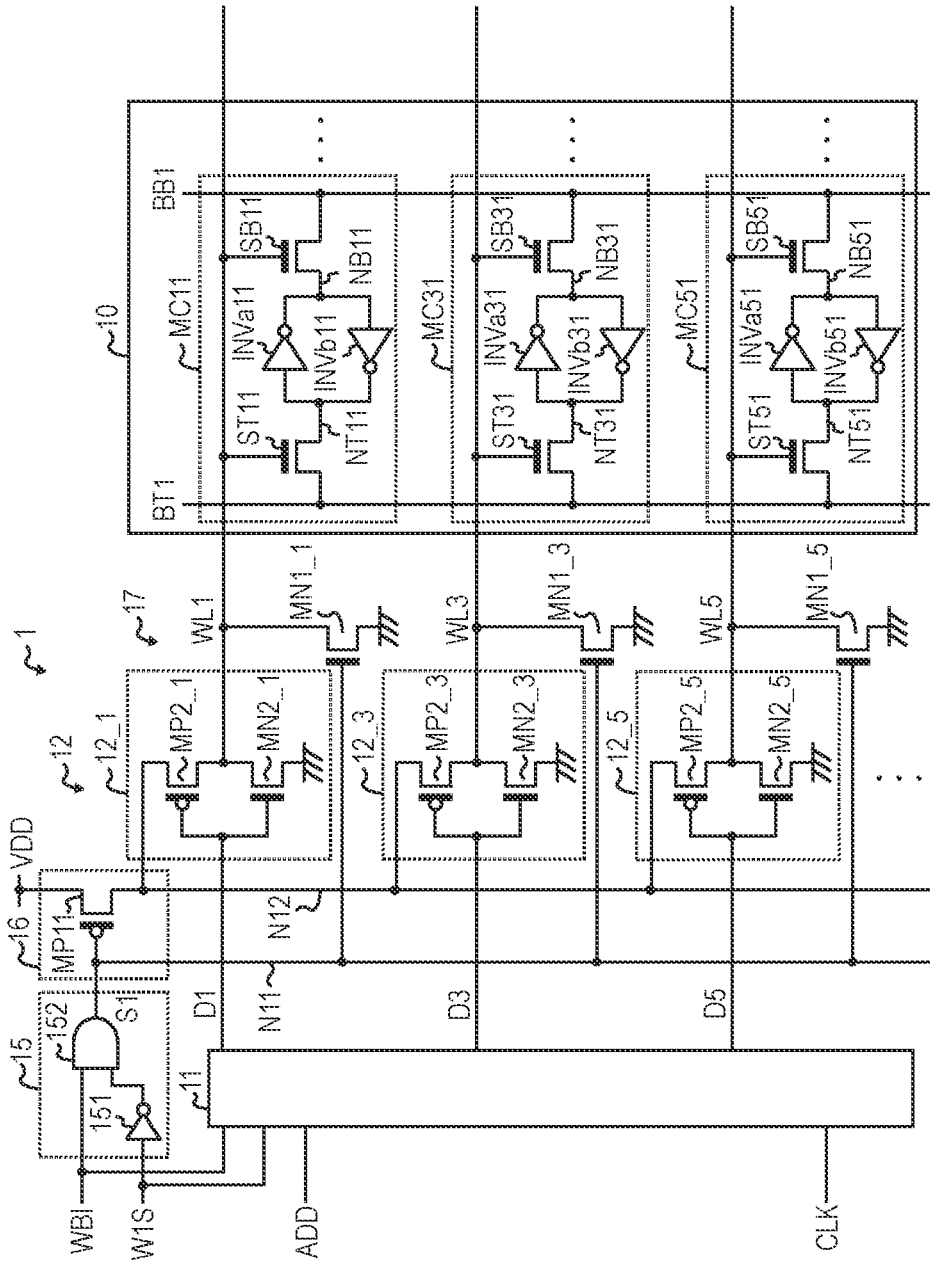
FIG. 2 is a circuit diagram showing specific configuration example of a part of a plurality of memory cells of odd-numbered rows and peripheral circuits thereof in the semiconductor memory device shown in FIG. 1.

FIG. 2 is a circuit diagram showing a specific configuration example of a part of a plurality of memory cells of odd-numbered rows and peripheral circuits thereof in the semiconductor memory device 1. Note that FIG. 2 shows only the memory cells MC11, MC31, and MC51 of the first, third, and fifth rows, which are a part of the memory cells of the odd-numbered rows among the plurality of memory cells of the memory cell array 10.

As shown in FIG. 2, in the semiconductor memory device 1, the mode switching circuit 15 includes at least an inverter 151, and an AND circuit 152.

In the mode switching circuit 15, the inverter 151 outputs an inverted signal of the setting signal (hereinafter, referred to as a setting signal W1S) supplied from the outside via a terminal W1S. The AND circuit 152 outputs, as a control signal S1, an AND operation result between a setting signal (hereinafter, referred to as a setting signal WBI) supplied from the outside via a terminal WBI and the output signal of the inverter 151 to a node N11.

The setting signal WBI is a signal for setting the operation mode of the semiconductor memory device 1. For example, the operation mode of the semiconductor memory device 1 is set to the normal operation mode by supplying a setting signal WBI with L level from the outside and is set to the test mode by supplying a setting signal WBI with H level from the outside.

Further, the setting signal W1S is a signal for controlling a plurality of word lines of odd-numbered rows, i.e., the word lines WL1, WL3, WL5 in FIG. 2, when the operation mode is the test mode. As will be described later in detail, when a plurality of word lines of odd-numbered rows is controlled by the setting signal W1S, a setting signal W0S is fixed to L level.

For example, when the operation mode of the semiconductor memory device 1 is set to the normal operation mode, since the setting signal WBI with L level is supplied from the outside, the mode switching circuit 15 outputs a control signal S1 with level. In contrast, when the operation mode of the semiconductor memory device 1 is set to the test mode, since the setting signal WBI with H level is supplied from the outside, the mode switching circuit 15 outputs a control signal S1 corresponding to the setting signal W1S.

The switch circuit 16 includes at least a P-channel MOS transistor (hereinafter, simply referred to as a transistor) MP11.

In the switch circuit 16, the transistor MP11 is provided between a power supply potential terminal (hereinafter, referred to as a power supply potential terminal VDD) to which a power supply potential VDD is supplied and a node N12, and the conduction state of the transistor MP11 is controlled based on the control signal S1 (the potential of the node N11) output from the mode switching circuit 15. For example, the transistor MP11 is controlled to be in an on state when the control signal S1 is L level and controlled to be in an off state when the control signal S1 is H level.

The transistor MP11 is configured to have a lower driving capability than the total driving capability of two or more P-channel MOS transistors (transistors MP2_1, MP2_3, etc.) provided in two or more word line drivers among the odd-numbered rows of the word line drivers 12_1 to 12_m. For example, the transistor MP11 is configured to have substantially the same driving capability as the P-channel MOS transistor provided in each of the word line drivers 12_1 to 12_m.

The switch circuit group 17 includes N-channel MOS transistors (hereinafter, simply referred to as transistors) MN1_1 to MN1_m as m switch circuits.

In the switch circuit group 17, each of the transistors MN1_1 to MN1_m is provided between each of the word lines WL1 to WLm and a reference potential terminal to which reference potential GND is supplied (hereinafter, referred to as a reference potential terminal GND).

Here, the plurality of transistors of the odd-numbered rows among the transistors MN1_1 to MN1_m is controlled to be in either an on state or an off state based on the control signal S1 (the potential of the node N11). For example, the plurality of transistors of the odd-numbered rows among the transistors MN1_1 to MN1_m is turned off when the control signal S1 is at L level and turned on when the control signal S1 is at H level.

In the example of FIG. 2, each of the transistors MN1_1, MN1_3, and MN1_5 is provided between each of the word lines WL1, WL3, and WL5 and the reference potential terminal GND, and is controlled to be in either the on state or the off state based on the control signal S1.

Each of the transistors MN1_1 to MN1_m is configured to have a lower driving capability than that of each of the transistors MN2_1 to MN2_m provided in the word line drivers 12_1 to 12_m.

Each of the word line drivers 12_1 to 12_m includes an inverter which is configured by a pair of P-channel MOS and N-channel MOS transistors. Specifically, any word line driver 12_i among the word line drivers 12_1 to 12_m includes a P-channel MOS transistor (hereinafter simply referred to as a transistor) MP 2_i and an N-channel MOS transistor (hereinafter simply referred to as transistor) MN 2_i.

Here, in any word line driver 12_p (p is any odd value from 1 to m) of the odd-numbered row among the word line drivers 12_1 to 12_m, a transistor MP2_p is provided between the node N12 and the word line WLp, and a transistor MN2_p is provided between the word line WLp and the reference potential terminal GND. Each of the transistors MP2_p and MN2_p is controlled to be in either an on state or an off state based on a decode signal Dp.

In the example FIG. 2, the word line driver 12_1 includes transistors MP2_1 and MN2_1 constituting an inverter, the word line driver 12_3 includes transistors MP2_3 and MN2_3 constituting an inverter, and the word line driver 12_5 includes transistors MP2_5 and MN2_5 constituting an inverter.

In the word line driver 12_1, the transistor MP2_1 is provided between the node N12 and the word line WL1 and is controlled to be in either the on state or the off state based on the decode signal D1. Further, in the word line driver 12_1, the transistor MN2_1 is provided between the word line WL1 and the reference potential terminal GND and is controlled to be in the on state or the off state complementarily to the transistor MP2_1 based on the decode signal D1.

In the word line driver 12_3, the transistor MP2_3 is provided between the node N12 and the word line WL3 and is controlled to be in either the on state or the off state based on the decode signal D3. Further, in the word line driver 12_3, the transistor MN2_3 is provided between the word line WL3 and the reference potential terminal GND and is controlled to be in the on state or the off state complementarily to the transistor MP2_3 based on the decode signal D3.

In the word line driver 12_5, the transistor MP2_5 is provided between the node N12 and the word line WL5 and is controlled to be in either the on state or the off state based on the decode signal D5. Further, in the word line driver 12 the transistor MN2_5 is provided between the word line WL5 and the reference potential terminal GND and is controlled to be in the on state or the off state complementarily to the transistor MP2_5 based on the decode signal D5.

Among the memory cells MC11 to MCmn of m rows×n columns, the memory cell MCij of the i-th row and the j-th column includes inverters INVaij and INVbij, and N-channel MOS transistors (hereinafter, simply referred to as transistors) STij and SBij. In the memory cell MCij, the transistor STij is provided between the bit line BTj and the node NTij and is controlled to be in either the on state or the off state based on the word line signal WLi. The transistor SBij is provided between the bit line BBj and the node NBij and is controlled to be in either the on state or the off state based on the word line signal WLi. The inverter INVaij is provided between the nodes NTij and NBij, inverts the logical value of the data stored in the node NTij and outputs the inverted data to the node NBij. The inverter INVbij is provided between the nodes NTij and NBij, inverts the logical value of the data stored in the node NBij and outputs the inverted data to the node NTij.

In the example of FIG. 2, the memory cell MC11 of the first row and first column includes inverters INVa11 and INVb11, and transistors ST11 and SB11. Further, the memory cell MC31 of the third row and the first column includes inverters INVa31 and INVb31, and transistors ST31 and SB31. Further, the memory cell MC51 of the fifth row and the first column includes inverters INVa51 and INVb51, and transistors ST51 and SB51.

In the memory cell MC11, the transistor ST11 is provided between the bit line BT1 and the node NT11 and is controlled to be in either the on state or the off state based on the word line signal WL1. The transistor SB11 is provided between the bit line BB1 and the nodal NB11 and is controlled to be in either the on state or the off state based on the word line signal WL1. The inverter INVa11 is provided between the nodes NT11 and NB11, inverts the logical value of the data stored in the node NT11 and outputs the inverted data to the node NB11. The inverter INVb11 is provided between the nodes NT11 and NB11, inverts the logical value of the data stored in the node NB11 and outputs the inverted data to the node NT11.

In the memory cell MC31, the transistor ST31 is provided between the bit line BT1 and the node NT31 and is controlled to be in either the on state or the off state based on the word line signal WL3. The transistor SB31 is provided between the bit line BB1 and the node NB31 and is controlled to be in either the on state or the off state based on the word line signal WL3. The inverter INVa31 is provided between the nodes NT31 and NB31, inverts the logical value of the data stored in the node NT31 and outputs the inverted data to the node NB31. The inverter INVb31 is provided between the nodes NT31 and NB31, inverts the logical value of the data stored in the node NB31 and outputs the inverted data to the node NT31.

In the memory cell MC51, the transistor ST51 is provided between the bit line BT1 and the node NT51 and is controlled to be in either the on state or the off state based on the word line signal WL5. The transistor SB51 is provided between the bit line BB1 and the nodal NB51 and is controlled to be in either the on state or the off state based on the word line signal WL5. The inverter INVa51 is provided between the nodes NT51 and NB51, inverts the logical value of the data stored in the node NT51 and outputs the inverted data to the node NB51. The inverter INVb51 is provided between the nodes NT51 and NB51, inverts the logical value of the data stored in the node NB51 and outputs the inverted data to the node NT51.

Figure 3:
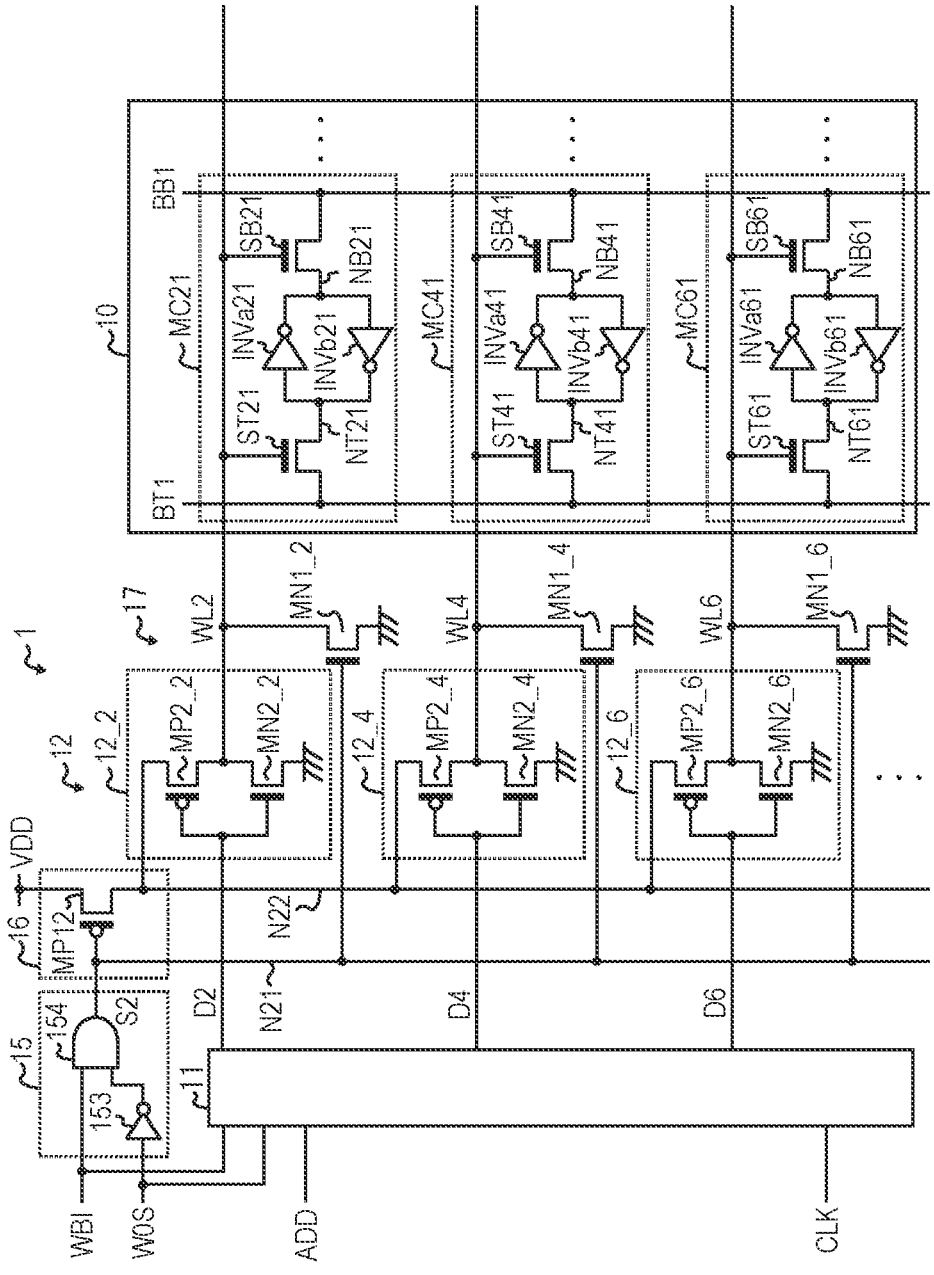
FIG. 3 is a circuit diagram showing specific configuration example of a part of a plurality of memory cells of even-numbered rows and peripheral circuits thereof in the semiconductor memory device shown in FIG. 1.

FIG. 3 is a circuit diagram showing a specific configuration example of a part of a plurality of memory cells of even-numbered rows and peripheral circuits thereof in the semiconductor memory device 1. Note that FIG. 3 shows only the memory cells MC21, MC41, and MC61 of the second, fourth, and sixth rows, which are a part of the memory cells of the even-numbered rows among the plurality of memory cells of the memory cell array 10.

As shown in FIG. 3, the mode switching circuit 15 further includes an inverter 153 and an AND circuit 154 for controlling whether or not to perform the burn-in test on the plurality of memory cells of the even-numbered rows, in addition to the inverter 151 and the AND circuit 152 for controlling whether or not to perform the burn-in test on the plurality of memory cells of the odd-numbered rows. Incidentally, in FIG. 3, only the inverter 153 and the AND circuit 154 of the components of the mode switching circuit 15 are shown.

The inverter 153 outputs an inverted signal of a setting signal (hereinafter, referred to as a setting signal W0S) supplied from the outside via a terminal W0S. The AND circuit 154 outputs, as a setting signal S2, an AND operation result between the setting signal WBI supplied from the outside via the terminal WBI and the output signal of the inverter 153 to a node N21.

Note that the setting signal W0S is a signal for controlling a plurality of word lines of even-numbered rows, i.e., the word lines WL2, WL4, and WL6 in the example of FIG. 3, when the operation mode is the test mode. When the plurality of word lines of even-numbered rows is controlled by the setting signal W0S, the setting signal W1S is fixed to L level.

For example, when the operation mode of the semiconductor memory device 1 is set to the normal operation mode, since the setting signal WBI with L level is supplied from the outside, the mode switching circuit 15 outputs a control signal S2 with L level. In contrast, when the operation mode of the semiconductor memory device 1 is set to the test mode, since the setting signal WBI with H level is supplied from the outside, the mode switching circuit 15 outputs a control signal S2 corresponding to the setting signal W0S.

The switch circuit 16 further includes a transistor MP12 provided corresponding to the plurality of word lines of the even-numbered rows, in addition to the transistor MP11 provided corresponding to the plurality of word lines of the odd-numbered rows. Incidentally, in FIG. 3, only the transistor MP12 of the components of the switch circuit 16 is shown.

In the switch circuit 16, the transistor MP12 is provided between the power supply potential terminal VDD and the node N22, and the conduction state thereof is controlled based on the control signal S2 (the potential of the node N22) output from the mode switching circuit 15. For example, the transistor MP12 is controlled to be in an on state when the control signal S2 is L level, is controlled to be in an off state when the control signal S2 is H level.

The transistor MP12 is configured to have a lower driving capability than the total driving capability of two or more P-channel MOS transistors (transistors MP2_2, MP2_4, etc.) provided in two or more word line drivers of the even-numbered rows among the word line drivers 12_1 to 12_m. For example, the transistor MP12 is configured to have substantially the same driving capability as the P-channel MOS transistor provided in each of the word line drivers 12_1 to 12_m.

In the switch circuit group 17, the plurality of transistors of the even-numbered rows among the transistors MN1_1 to MN1_m is controlled to be in either an on state or an off state based on the control signal S2 (the potential of the node N21). For example, the plurality of transistors of even-numbered rows among the transistors MN1_1 to MN1_m is turned off when the control signal S2 is at L level and turned on when the control signal S2 is at H level.

In the example of FIG. 3, each of the transistors MN1_2, MN1_4, and MN1_6 is provided between each of the word lines WL2, WL4, and WL6 and the reference potential terminal GND, and is controlled to be in either the on state or the off state based on the control signal S2.

As described above, each of the transistors MN1_1 to MN1_m is configured to have a lower driving capability than that of each of the transistors MN2_1 to MN2_m provided in the word line drivers 12_1 to 12_m.

In any word line driver 12_q (q is any even value from 1 to m) of an even-numbered row among the word line drivers 12_1 to 12_m, a transistor MP2_q is provided between the node N22 and the word line WLq, and a transistor MN2_q is provided between the word line WLq and the reference potential terminal GND. The transistors MP2_q and MN2_q are controlled to be in either the on state or the off state based on the decode signal Dq.

In the example of FIG. 3, the word line driver 12_2 includes transistors MP2_2 and MN2_2 constituting an inverter, the word line driver 12_4 includes transistors MP2_4 and MN2_4 constituting an inverter, and the word line driver 12_6 includes transistors MP2_6 and MN2_6 constituting an inverter.

In the word line driver 12_2, the transistor MP2_2 is provided between the node N22 and the word line WL2 and is controlled to be in either the on state or the off state based on the decode signal D2. Further, in the word line driver 12_2, the transistor MN2_2 is provided between the word line WL2 and the reference potential terminal GND and is controlled to be in the on state or the off state complementarily to the transistor MP2_2 based on the decode signal D2.

In the word line driver 12_4, the transistor MP2_4 is provided between the node N22 and the word line WL4 and is controlled to be in either the on state or the off state based on the decode signal D4. Further, in the word line driver 12_4, the transistor MN2_4 is provided between the word line WL4 and the reference potential terminal GND and is controlled to be in the on state or the off state complementarily to the transistor MP2_4 based on the decode signal D4.

In the word line driver 12_6, the transistor MP2_6 is provided between the node N22 and the word line WL6 and is controlled to be in either the on state or the off state based on the decode signal D6. Further, in the word line driver 12_6, the transistor MN2_6 is provided between the word line WL6 and the reference potential terminal GND and is controlled to be in the on state or the off state complementarily to the transistor MP2_6 based on the decode signal D6.

Further, in the example of FIG. 3, the memory cell MC21 of the second row and the first column includes inverters INVa21 and INVb21, and transistors ST21 and SB21. Further, the memory cell MC41 of the fourth row and the first column includes inverters INVa41 and INVb41, and transistors ST41 and SB41. Further, the memory cell MC61 of the sixth row and the first column includes inverters INVa61 and INVb61, and transistors ST61 and SB61.

In the memory cell MC21, the transistor ST21 is provided between the bit line BT1 and the node NT21 and is controlled to be in either the on state or the off state based on the word line signal WL2. The transistor SB21 is provided between the bit line BB1 and the nodal NB21 and is controlled to be in either the on state or the off state based on the word line signal WL2. The inverter INVa21 is provided between the nodes NT21 and NB21, inverts the logical value of the data stored in the node NT21 and outputs the inverted data to the node NB21. The inverter INVb21 is provided between the nodes NT21 and NB21, inverts the logical value of the data stored in the node NB21 and outputs the inverted data to the node NT21.

In the memory cell MC41, the transistor ST41 is provided between the bit line BT1 and the node NT41 and is controlled to be in either the on state or the off state based on the word line signal WL4. The transistor SB41 is provided between the bit line BB1 and the nodal NB41 and is controlled to be in either the on state or the off state based on the word line signal WL4. The inverter INVa41 is provided between the nodes NT41 and NB41, inverts the logical value of the data stored in the node NT41 and outputs the inverted data to the node NB41. The inverter INVb41 is provided between the nodes NT41 and NB41, inverts the logical value of the data stored in the node NB41 and outputs the inverted data to the node NT41.

In the memory cell MC61, the transistor ST61 is provided between the bit line BT1 and the node NT61 and is controlled to be in either the on state or the off state based on the word line signal WL6. The transistor SB61 is provided between the bit line BB1 and the nodal NB61 and is controlled to be in either the on state or the off state based on the word line signal WL6. The inverter INVa61 is provided between the nodes NT61 and NB61, inverts the logical value of the data stored in the node NT61 and outputs the inverted data to the node NB61. The inverter INVb61 provided between the nodes NT61 and NB61, inverts the logical value of the data stored in the node NB61 and outputs the inverted data to the node NT61.

The Operation of the Semiconductor Memory Device 1

Figure 4:
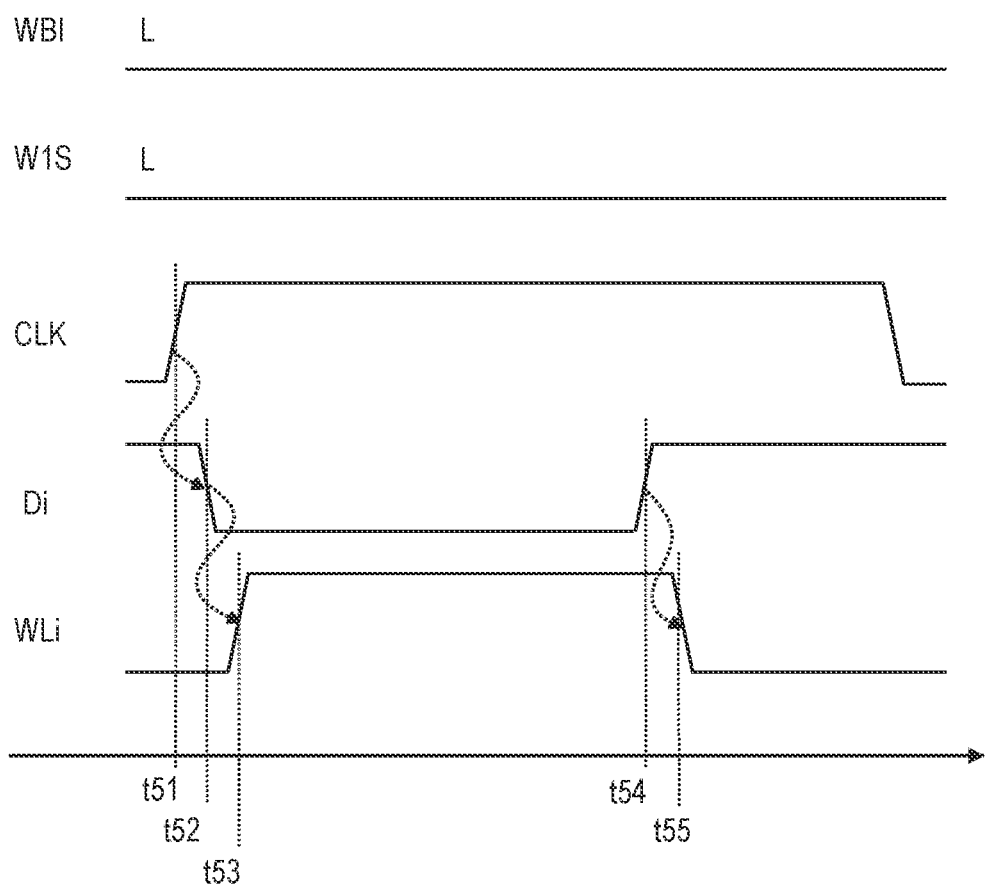
FIG. 4 is a timing chart showing an operation of the semiconductor memory device shown in FIG. 2 in a normal operation mode.
Figure 5:
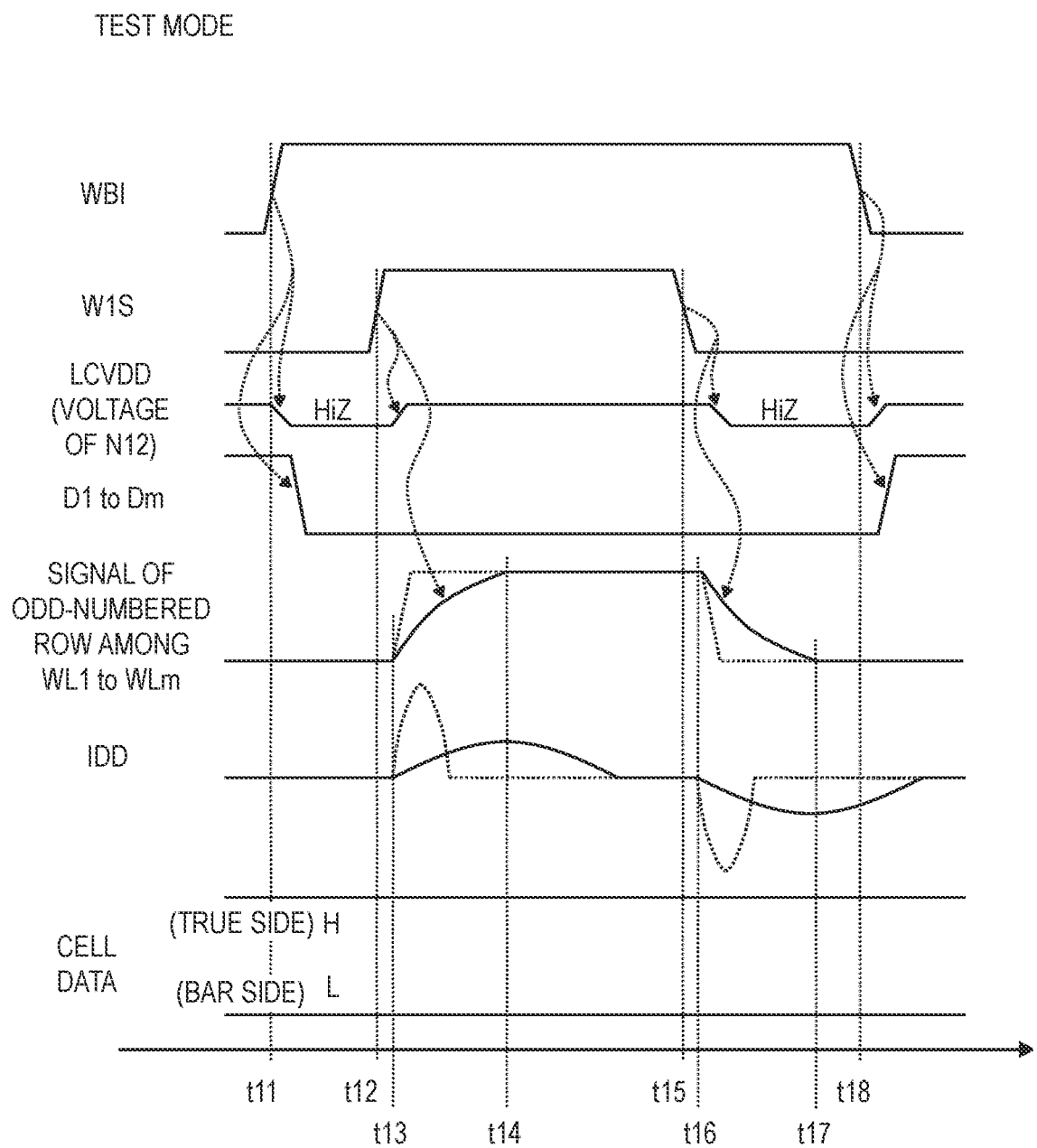
FIG. 5 is a timing chart showing an operation of the semiconductor memory device shown in FIG. 2 in a test mode.

Next, the operation of the semiconductor memory device 1 will be described with reference to FIGS. 4 and 5 in addition to FIGS. 1 to 3. FIG. 4 is a timing chart showing the operation of the semiconductor memory device 1 in the normal operation mode. FIG. 5 is a timing chart showing the operation of the semiconductor memory device 1 in the test mode.

The Operation of the Semiconductor Memory Device 1 in the Normal Operation Mode First, the operation of the semiconductor memory device 1 in the normal operation mode will be described with reference mainly to FIG. 4.

In the normal operation mode, the setting signal WBI is fixed to L level. Therefore, the mode switching circuit 15 continues to output the control signal S1 with L level and the control signal S2 with L level. The transistors MP11 and MP12 are always turned on, and the transistors MN1_1 to MN1_m are always turned off. Therefore, the potential LCVDD of the nodes N12 and N22 constantly indicates the power supply potential VDD level.

In synchronization with the rising edge (at time t51) of the clock signal CLK, the row address decoder 11 temporarily lowers the decode signal Di (i is an integer from 1 to m) corresponding to the address specified by the address signal ADD among the m decode signals D1 to Dm to the L level (from time t52 to time t54). In response to this, the word line driver 12_i raises the word line signal WLi to the H level temporarily (from time t53 to time t55). The memory cells MCi1 to MCin connected to the word line WLi is then accessed. Accessing the memory cells MCi1 to MCin, i.e., reading or writing data to any of the memory cells MCi1 to MCin, is as previously described.

The Operation of the Semiconductor Memory Device 1 in the Test Mode

Next, the operation of the semiconductor memory device 1 in the test mode will be described with reference mainly to FIGS. 2 and 5.

In the burn-in test performed on the plurality of memory cells of the odd-numbered rows and the burn-in test performed on the plurality of memory cells of the even-numbered rows, the basic process flow is the same except that the control of the setting signals W0S and W1S is reversed. Accordingly, in the following description, only the burn-in test performed on the plurality of memory cells of the odd-numbered rows among the burn-in tests performed on the plurality of memory cells provided in the memory cell array 10 will be described.

Further, in order prevent the through current from flowing, it is assumed that data of the same value is written in advance in the plurality of memory cells that are accessed simultaneously during the burn-in test. In this example, the True side (each of nodes NT11 to NTmn) of each of the memory cells MC11 to MCmn indicates H level, and the Bar side (each of nodes NB11 to NBmn) of each of the memory cells MC11 to MCmn indicates L level.

In a state where the setting signal WBI is fixed to the H level, the test mode includes the first period (from time t11 to time t12) in which the setting signal W1S indicates the L level, the second period (from time t12 to time t15) in which the setting signal W1S indicates the H level, and the third period (from time t15 to time t18) in which the setting signal W1S indicates the L level.

First, while the setting signal W1S indicates the L level, the setting signal WBI transitions from L level to the H level (at time t11). As a result, since the control signal S1 transitions from the L level to the H level, the transistor MP11 is turned off, and the plurality of transistors (in the example of FIG. 2, MN1_1, MN1_3, and MN1_5) of the odd-numbered rows among the transistors MN1_1 to MN1_m is turned on. Thus, since the node N12 is in the HiZ state, the word line is not driven by the plurality of word line drivers of the odd-numbered rows among the word line drivers 12_1 to 12_m. At this time, the plurality of word line signals of the odd-numbered rows among the word line signals WL1 to WLm indicates L level.

Incidentally, the setting signal W0S is fixed to the L level. Therefore, as the setting signal WBI transitions from the L level to the H level, since the control signal S2 transitions from the L level to the H level, the transistor MP12 is turned off, and the plurality of transistors of the even-numbered rows among the transistors MN1_1 to MN1_m is turned on. That is, all of the transistors MP11 and MP12 are turned off, and all of the transistors MN1_1 to MN 1_m are turned on. As a result, the word line is not driven by each of the word line drivers 12_1 to 12_m because all of the nodes N12 and N22 are in the HiZ state. At this time, all of the word line signals WL1 to WLm indicate L level.

In addition, as the setting signal WBI transitions from the L level to the H level, the row address decoder 11 causes the decode signals D1 to Dm to transition from the H level to the L level.

Thereafter, the setting signal W1S transitions from the L level to the H level (at time t12). As a result, since the control signal S1 transitions from the H level to the L level, the transistor MP11 is switched from the off state to the on state, and the plurality of transistors (in the example of FIG. 2, MN1_1, MN1_3, and MN1_5) of the odd-numbered rows among the transistors MN1_1 to MN1_m is switched from the on state to the off state. As a result, since the potential LCVDD of the node N12 indicates the power supply potential VDD level, the plurality of word line drivers of the odd-numbered rows among the word line drivers 12_1 to 12_m causes the plurality of word line signals of the odd-numbered rows among the word line signals WL1 to WLm to transition from the L level to the H level (from time t13 to time t14).

Here, the transistor MP11 is configured to have a lower driving capability than the total driving capability of the plurality of (at least two) P-channel MOS transistors provided in the plurality of (at least two) word line drivers of the odd-numbered rows. For example, the transistor MP11 is configured to have substantially the same driving capability as the P-channel MOS transistor provided in each of the word line drivers. Incidentally, the driving capability of the transistor is, for example, the on-resistance of the transistor (ease of current flow when the transistor is turned on), and it can be said that the driving capability is higher as the on-resistance is small.

Therefore, the time required for the transition (solid line) of the plurality of word line signals of the odd-numbered rows from the L level to the H level in the test mode becomes longer than the time required for the transition (broken line) of any word line signal from the L level to the H level in the normal operation mode (from time t13 to time t14). In other words, the slew rate of the rising edge of the plurality of word line signals of the odd-numbered rows in the test mode is slower than the slew rate of the rising edge of any word line signal in the normal operation mode. Thus, the peak current IDD which is a peak of the current flowing through the semiconductor memory device 1 is suppressed, and since the voltage drop of the power supply potential line is suppressed, it is possible to prevent destruction of the cell data. As a result, the semiconductor memory device 1 can apply a desired stress to a plurality of memory cells to be tested in the test mode, and therefore, a highly reliable test can be performed.

Thereafter, the setting signal W1S transitions from the H level to the L level (at time t15). As a result, since the control signal S1 transitions from the L level to the H level, the transistor MP11 is switched from the on state to the off state, and the plurality of transistors (in the example of FIG. 2, MN1_1, MN1_3, and MN1_5) of the odd-numbered rows among the transistors MN1_1 to MN1_$m$ is switched from the off state to the on state. Thus, since the node N12 is in the HiZ state, the word line is not driven by the plurality of word line drivers of odd-numbered rows among the word line drivers 12_1 to 12_$m$. At this time, the plurality of word line signals of the odd-numbered rows among the word line signals WL1 to WLm transitions from the H level to the L level (from time t16 to time t17).

Here, each of the transistors MN1_1 to MN1_$m$ is configured to have a lower driving capability than that of each of the transistors MN2_1 to MN2_$m$ provided in the word line drivers 12_1 to 12_$m$.

Therefore, the time required for the transition (solid line) of the plurality of word line signals of the odd-numbered rows from the H level to the L level in the test mode becomes longer than the time required for the transition (broken line) of any word line signal from the H level to the L level in the normal operation mode (from time t16 to time t17). In other words, the slew rate of the falling edge of the plurality of word line signals of the odd-numbered rows is slower than the slew rate of the falling edge of any word line signal the normal operation mode. Thus, since the peak current IDD is suppressed and the voltage rise (floating) of the reference potential line is suppressed, it is possible to prevent destruction of the cell data. As a result, the semiconductor memory device 1 can apply a desired stress to a plurality of memory cells to be tested in the test mode, and therefore, a highly reliable test can be performed.

As described above, in the semiconductor memory device 1 according to the present embodiment, during the burn-in test, the word lines of the plurality of rows are simultaneously activated and a desired stress is simultaneously applied to the memory cells of the plurality of rows, whereby shortening the test time. Further, the semiconductor memory device 1 according to the present embodiment suppresses the voltage drop of the power supply potential line and the voltage rise (floating) of the reference potential line by simultaneously activating or deactivating the word lines of the plurality of rows at a slew rate slower than the slew rate during the normal operation, and as a result, it is possible to perform the burn-in test with high reliability.

In the present embodiment, the case where the burn-in test for the plurality of memory cells of the odd-numbered rows and the burn-in test for the plurality of memory cells of the even-numbered rows are performed separately has been described as an example, but the present disclosure is not limited to this. For example, a burn-in test may be performed simultaneously on all memory cells provided in the memory cell array 10.

Second Embodiment

Figure 6:
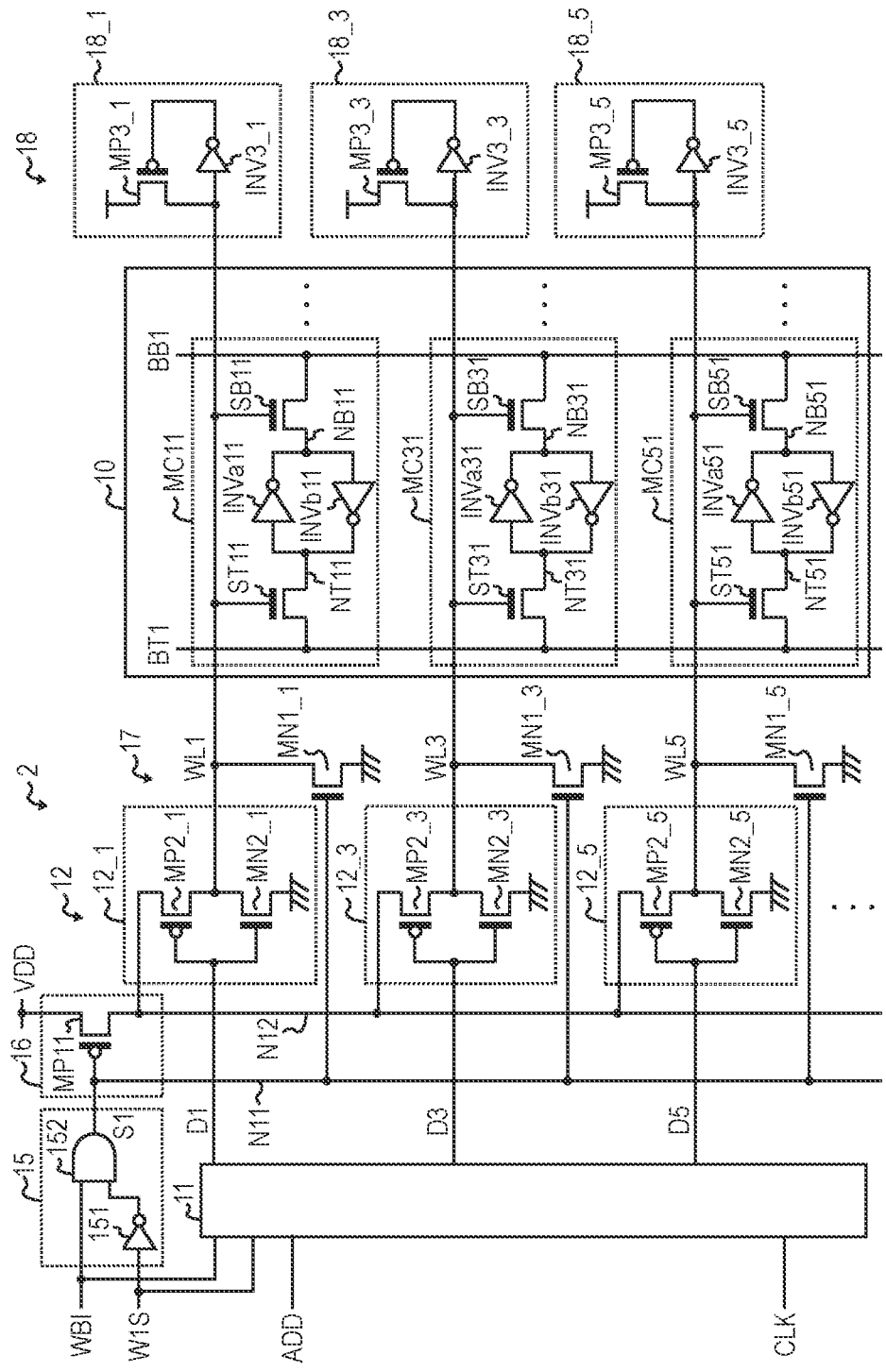
FIG. 6 is a circuit diagram showing a specific configuration example of a part of a semiconductor memory device according to a second embodiment.

FIG. 6 is a circuit diagram showing a specific configuration example of a part of a plurality of memory cells of odd-numbered rows and peripheral circuits thereof in a semiconductor memory device 2 according to a second embodiment. The semiconductor memory device 2 further includes an auxiliary circuit group 18 as compared with the semiconductor memory device 1. Other configurations of the semiconductor memory device 2 are the same as those of the semiconductor memory device 1.

The auxiliary circuit group 18 includes m auxiliary circuits 18_1 to 18_$m$ corresponding to m word lines WL1 to WLm. Each of the auxiliary circuits 18_1 to 18_$m$ is connected to the other end (hereinafter, also referred so as a far end) of each of the word lines WL1 to WLm, which different from one end (hereinafter, also referred to as a near end) of each of the word lines WL1 to WLm connected to the word line drivers 12_1 to 12_$m$.

Each of the auxiliary circuits 18_1 to 18$m$ includes a set of an inverter and a P-channel MOS transistor.

Specifically, any auxiliary circuit 18_$i$ among the auxiliary circuits 18_1 to 18_$m$ includes an inverter INV3_$i$, and a P-channel MOS transistor (hereinafter, simply referred to as a transistor) MP3_$i$. An input terminal of the inverter INV3_$i$ is connected to the other end of the word line and an output terminal of the inverter INV3_$i$ is connected to the gate of the transistor MP3_$i$. The transistor MP3_$i$ is provided between the power supply potential terminal VDD and the other end (far end) of the word line and is controlled to be in either an on state or an off state based on the output signal of the inverter INV3_$i$.

In the example FIG. 6, the auxiliary circuit 18_1 includes an inverter INV3_1 and a transistor MP3_1. Further, the auxiliary circuit 18_3 includes an inverter INV3_3 and a transistor MP3_3. Further, the auxiliary circuit 18_5 includes an inverter INV3_5 and a transistor MP3_5.

In the auxiliary circuit 18_1, the output terminal of the inverter INV3_1 is connected to the gate of the transistor MP3_1. The transistor MP3_1 is provided between the power supply potential terminal VDD and the other end of the word line WL1 and is controlled to be in either the on state or the off state based on the output signal of the inverter INV3_1. In the auxiliary circuit 18_3, the output terminal of the inverter INV3_3 is connected to the gate of the transistor MP3_3. The transistor MP3_3 is provided between the power supply potential terminal VDD and the other end of the word line WL3 and is controlled to be in either the on state or the off state based on the output signal of the inverter INV3_3. In the auxiliary circuit 18_5, the output terminal of the inverter INV3_5 is connected to the gate of the transistor MP3_5. The transistor MP3_5 is provided between the power supply potential terminal VDD and the other end of the word line WL5 and controlled to be in either the on state or the off state based on the output signal of the inverter INV3_5.

The Operation of the Semiconductor Memory Device 2

Figure 7:
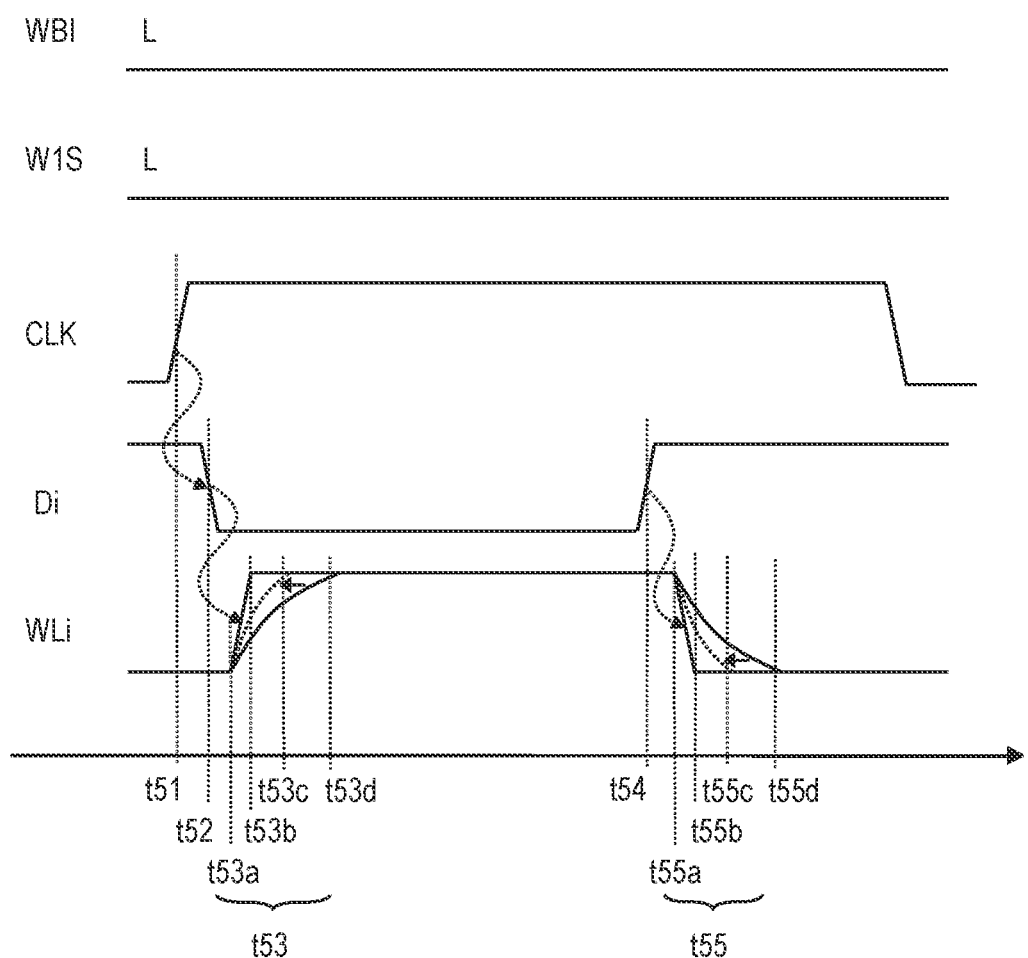
FIG. 7 is a timing chart showing an operation of the semiconductor memory device shown in FIG. 6 in a normal operation mode.
Figure 8:
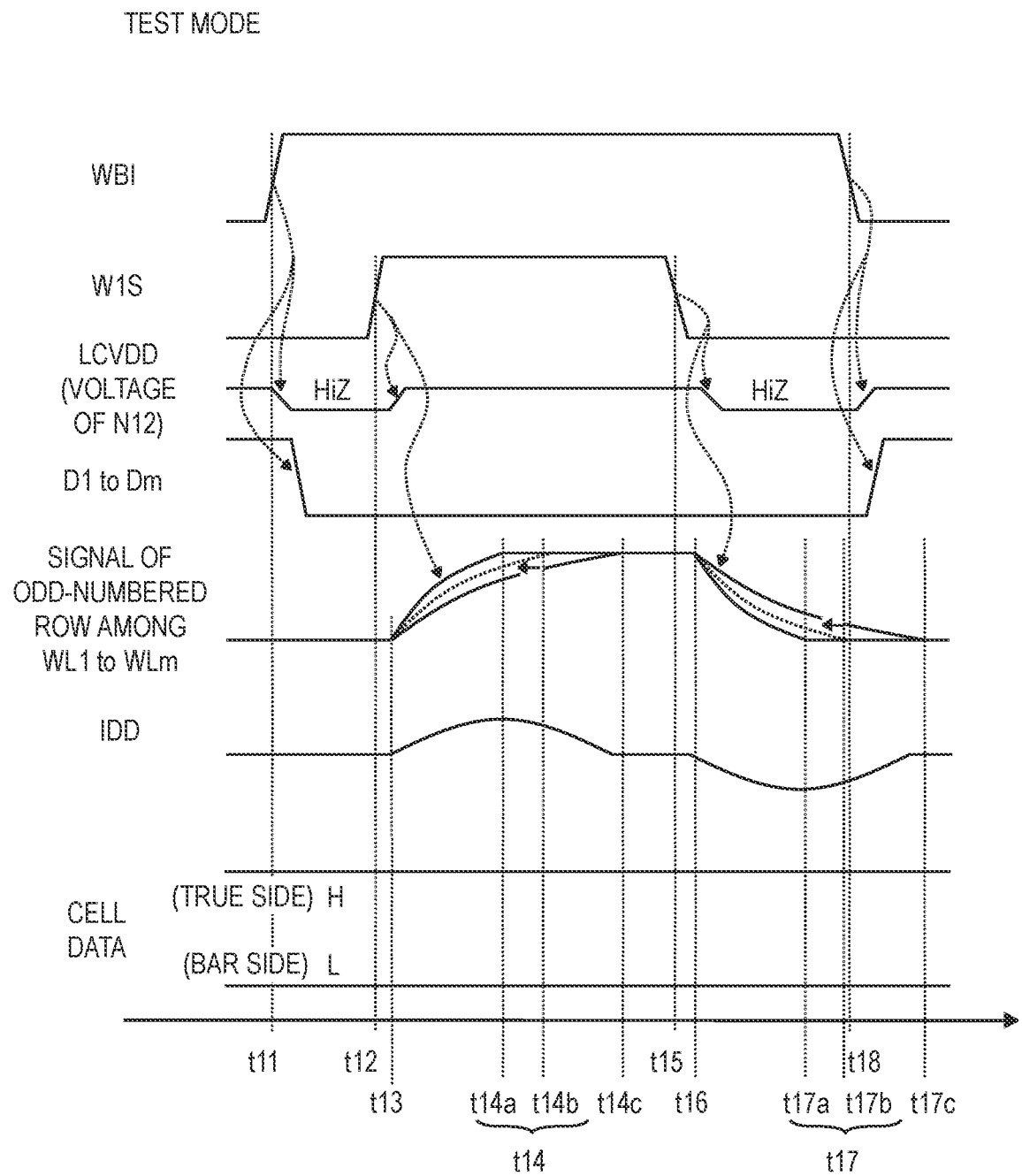
FIG. 8 is a timing chart showing an operation of the semiconductor memory device shown in FIG. 6 in a test mode.

Next, the operation of the semiconductor memory device 2 will be described with reference to FIGS. 7 and 8 in addition to FIG. 6. FIG. 7 is a timing chart showing the operation of the semiconductor memory device 2 in the normal operation mode. FIG. 8 is a timing chart showing the operation of the semiconductor memory device 2 in the test mode.

The Operation of the Semiconductor Memory Device 2 in the Normal Operation Mode

First, the operation of the semiconductor memory device 2 in the normal operation mode will be described with reference mainly to FIG. 7.

In the normal operation mode, the setting signal WBI is fixed to L level. Therefore, the mode switching circuit 15 continues to output the control signal S1 with L level, and the control signal S2 with L level. Therefore, the transistors MP11 and MP12 are always turned on, and the transistors MN1_1 to MN1_$m$ are always turned off. Therefore, the potential LCVDD of the nodes N12 and N22 constantly indicates the power supply potential VDD level.

In synchronization with the rising edge (at time t51) of the clock signal CLK, the row address decoder 11 temporarily lowers the decode signal Di (i is an integer from 1 to m) corresponding to the address specified by the address signal ADD among the m decode signals D1 to Dm to the L level (from time t52 to time t54). In response to this, the word line driver 12_$i$ raises the word line signal WLi to the H level temporarily (from time t53 to time t55). The memory cells MCi1 to MCin connected to the word line WLi are then accessed. Accessing the memory cells MCi1 to MCin, i.e., reading or writing data to any of the memory cells MCi1 to MCin, is as previously described.

Here, in the configuration in which the auxiliary circuits 18_1 to 18_$m$ are not provided, for example, when the word line WLi is activated by the word line drivers 12_$i$, the difference between the time (from time t53$a$ to time t53$b$) required for the transition (solid line) of the voltage level at the near end side of the word line WLi from the L level to the H level and the time (from time t53$a$ to time 53$d$) required for the transition (dashed line) of the voltage level at the far end side of the word line WLi from the L level to the H level becomes large. In other words, the difference between the timing of witching the voltage level at the near end side of the word line WLi from the L level to the H level and the timing of switching the voltage level at the far end side of the word line WLi from the L level to the H level becomes large.

Therefore, in the present embodiment, the auxiliary circuits 18_1 to 18_$m$ are respectively provided at the far ends of the word lines WL1 to WLm. Therefore, for example, in the case where the word line WLi is activated by the word line driver 12_$i$, when the potential at the far end side of the word line WLi rises from the reference potential and reaches a threshold potential (first threshold potential) of the inverter INV 3_$i$, the output signal of the inverter INV 3_$i$ switches from the H level to the L level. Accordingly, since the transistor MP3_$i$ is switched from the off state the on state, the potential at the far end side of the word line WLi is quickly pulled up.

Thus, the difference between the time (from time t53$a$ to time t53$b$) required for the transition (solid line) of the voltage level at the near end side of the word line WLi from the L level to the H level and the time (from time t53$a$ to time t53$c$) required for the transition (broken line) of the voltage level at the far end side of the word line WLi from the L level to the H level becomes small. In other words, the difference between the timing of switching the voltage level at the near end side of the word line WLi from the L level to the H level and the timing of switching the voltage level at the far end side of the word line WLi from the L level to the H level becomes small. Thereby, the semiconductor memory device 2 can realize high-speed normal operation.

Incidentally each of the auxiliary circuits 18_1 to 18_$m$ may include not only the pull-up circuit to assist in raising the potential at the far end of each of the word lines WL1 to WLm, but also the pull-down circuit to assist in lowering the potential at the far end of each of the word lines WL1 to WLm. Specifically, for example, the auxiliary circuit 18_$i$ may further include an N-channel MOS transistor provided between the far end of the word line WLi and the reference potential terminal GND, and controlled to be in either an on state or an off state based on the output signal of the inverter INV3_$i$. Thus, for example, in the case where the word line is deactivated by the word line driver 12_$i$, when the potential at the far end side of the word line WLi drops from the power supply potential and reaches a threshold potential (second threshold potential) of the inverter INV 3_$i$, the output signal of the inverter INV 3_$i$ switches from the L level to the H level. Accordingly, since the transistor MP3_$i$ is switched from the on state to the off state and the transistor MN3_$i$ is switched from the off state to the on state, the potential at the far end side of the word line WLi is quickly pulled down.

Thus, for example, when the word line WLi is deactivated by the word line driver 12_$i$, the difference between the time (from time t55$a$ to time t55$b$) required for the transition (solid line) of the voltage level at the near end side of the word line WLi from the H level to the L level and the time (from time t55$a$ to time t55$c$) required for the transition (broken line) of the voltage level at the far end side of the word line WLi from the H level to the L level becomes smaller than that when the pull-down circuit is not provided (from time t55$a$ to time t55$d$). Thereby, the semiconductor memory device 2 can realize a higher speed of the normal operation.

The Operation of the Semiconductor Memory Device 2 in the Test Mode

Next, the operation of the semiconductor memory device 2 in the test mode will be described with reference mainly to FIGS. 6 and 8.

First, while the setting signal W1S indicates the L level, the setting signal WBI transitions from the L level to the H level (time t11). As a result, since the control signal S1 transitions from the L level to the H level, the transistor MP11 is turned off, and the plurality of transistors (in the example of FIG. 6, MN1_1, MN1_3, and MN1_5) of the odd-numbered rows among the transistors MN1_1 to MN1_$m$ is turned on. Thus, since the node N12 is in the HiZ state, the word line is not driven by the plurality of word line drivers of the odd-numbered rows among the word line drivers 12_1 to 12_$m$. At this time, the plurality of word line signals of the odd-numbered rows among the word line signals WL1 to WLm indicates the L level.

Incidentally, the setting signal W0S is fixed to the L level. Therefore, as the setting signal WBI transitions from the L level to the H level, since the control signal S2 transitions from the L level to the H level, the transistor MP12 is turned off, and the plurality of transistors of the even-numbered rows among the transistors MN1_1 to MN1_$m$ is turned on. That is, all of the transistors MP11 and MP12 are turned off, and all of the transistors MN1_1 to MN 1_$m$ are turned on. As a result, the word line is not driven by each of the word line drivers 12_1 to 12_$m$ because all of the nodes N12 and N22 are in the HiZ state. At this time, all of the word line signals WL1 to WLm indicate L level.

In addition, as the setting signal WBI transitions from the L level to the H level, the row address decoder 11 causes the decode signals D1 to Dm to transition from the H level to the L level.

Thereafter, the setting signal W1S transitions from the L level to the H level (at time t12). As a result, since the control signal S1 transitions from the H level to the L level, the transistor MP11 is switched from the off state the on state, and the plurality of transistors (in the example of FIG. 6, MN1_1, MN1_3, and MN1_5) of the odd-numbered rows among the transistors MN1_1 to MN1_m is switched from the on state to the off state. As a result, since the potential LCVDD of the node N12 indicates the power supply potential VDD level, the plurality of word line drivers of the odd-numbered rows among the word line drivers 12_1 to 12_m causes the plurality of word line signals of the odd-numbered rows among the word line signals WL1 to WLm to transition from the L level to the H level (from time t13 to time t14).

Here, the transistor MP11 is configured to have a lower driving capability than the total driving capability of the plurality of (at least two) P-channel MOS transistors provided in the plurality of (at least two) word line drivers of the odd-numbered rows. For example, the transistor MP11 is configured to have substantially the same driving capability as the P-channel MOS transistor provided in each of the word line drivers.

Thus, the time required for the transition of the plurality of word line signals of the odd-numbered rows from the L level to the H level in the test mode becomes longer than the time required for the transition of any word line signal from the L level to the H level in the normal operation mode (from time t13 to time t14). In other words, the slew rate of the rising edge of the plurality of word line signals of the odd-numbered rows in the test mode is slower than the slew rate of the rising edge of any word line signal in the normal operation mode. Thus, since the peak current IDD is suppressed and the voltage drop of the power supply potential line is suppressed, it is possible to prevent destruction of the cell data. As a result, the semiconductor memory device 2 can apply a desired stress to a plurality of memory cells to be tested in the test mode, and therefore, a highly reliable test can be performed.

Here, in the configuration in which the auxiliary circuits 18_1 to 18_m are not provided, when a plurality of word lines in odd-numbered rows among the word lines WL1 to WLm is activated, the difference between the time (from time t13 to time t14a) required for the transition (solid line) of the voltage level at the near end side of the plurality of word lines of the odd-numbered rows from the L level to the H level and the time (from time t13 to time t14c) required for the transition (dashed line) of the voltage level at the far end side of the plurality of word lines of the odd-numbered rows from the L level to the H level becomes large. In other words, the difference between the timing of switching the voltage level at the near end side of the plurality of word lines of the odd-numbered rows from the L level to the H level and the timing of switching the voltage level at the far end side of the plurality of word lines of the odd-numbered rows from the L level to the H level becomes large.

Therefore, in the present embodiment, the auxiliary circuits 18_1 to 18_m are respectively provided at the far ends of the word lines WL1 to WLm. Therefore, when a plurality of word lines in an odd-numbered row of word lines WL1 to WLm are activated, the potential at the far end of each word line in the odd-numbered row rises from the reference potential and reaches the threshold potential (first threshold potential) of the inverter in the auxiliary circuit, the output signal of the inverter is switched from the H level to the L level. As a result, the transistor in the auxiliary circuit switches from off to on, so that the potential at the distal end of the plurality of word lines in the odd row is rapidly pulled up.

Thus, the difference between the time (from time t13 to time t14a) required for the transition (solid line) of the voltage level at the near end side of the plurality of word lines of the odd-numbered rows from the L level to the H level and the time (from time t13 to time t14b) required for the transition (broken line) of the voltage level at the far end side of the plurality of word lines of the odd-numbered rows from the L level to the H level becomes small. In other words, the difference between the timing of switching the voltage level at the near end side of the plurality of word lines of the odd-numbered rows from the L level to the H level and the timing of switching the voltage level at the far end side of the plurality of word lines of the odd-numbered rows from the L level to the H level becomes small. Thereby, in the test mode, the semiconductor memory device 2 can reduce the difference in time for stressing the plurality of memory cells, and thus can apply appropriate stress to the plurality of memory cells.

Subsequent operations in the test mode of the semiconductor memory device 2 are the same as those of the semiconductor memory device 1, and therefore description there is omitted.

Incidentally, each of the auxiliary circuits 18_1 to 18_m may include not only a pull-up circuit to assist in raising the potential at the far end of each of the word lines WL1 to WLm, but also a pull-down circuit to assist in lowering the potential at the far end of each of the word lines WL1 to WLm. Specifically, for example, the auxiliary circuit 18_i may further include an N-channel MOS transistor provided between the far end of the word line WLi and the reference potential terminal GND, and controlled to be in either an on state or an off state based on the output signal of the inverter INV3_i. Thus, for example, in the case where a plurality word lines in odd-numbered rows is deactivated, when the potential at the far end side of the plurality of word lines of the odd-numbered rows drops from the power supply potential and reaches a threshold potential (second threshold potential) of the inverter in the auxiliary circuit, the output signal of the inverter is switched from the L level to the H level. Consequently, the P-channel MOS transistor in the auxiliary circuit switches from the on state to the off state and the N-channel MOS transistor switches from the off state to the on state, so that the potential at the distal end of the plurality of word lines of the odd-numbered rows is rapidly pulled down.

As a result, when the plurality of word lines of the odd-numbered rows are activated, the difference between the time (from time t16 to time t17a) required for the transition (solid line) of the voltage level at the near end side of the plurality of word lines of the odd-numbered rows from the H level to the L level and the time (from time t16 to time t17c) required for the transition (broken line) of the voltage level at the far end side of the plurality of word lines of the odd-numbered rows from the H level to the L level becomes smaller than that when the pull-down circuit is not provided (from time t16 to time t17c). Thereby, the semiconductor memory device 2 can further reduce the difference in time for stressing the plurality of memory cells, and thus can apply more appropriate stress to the plurality of memory cells. Hereinafter, a configuration in which each of the auxiliary circuits 18_1 to 18_m includes not only a pull-up circuit but also a pull-down circuit will be briefly described with reference to FIG. 9.

Figure 9:
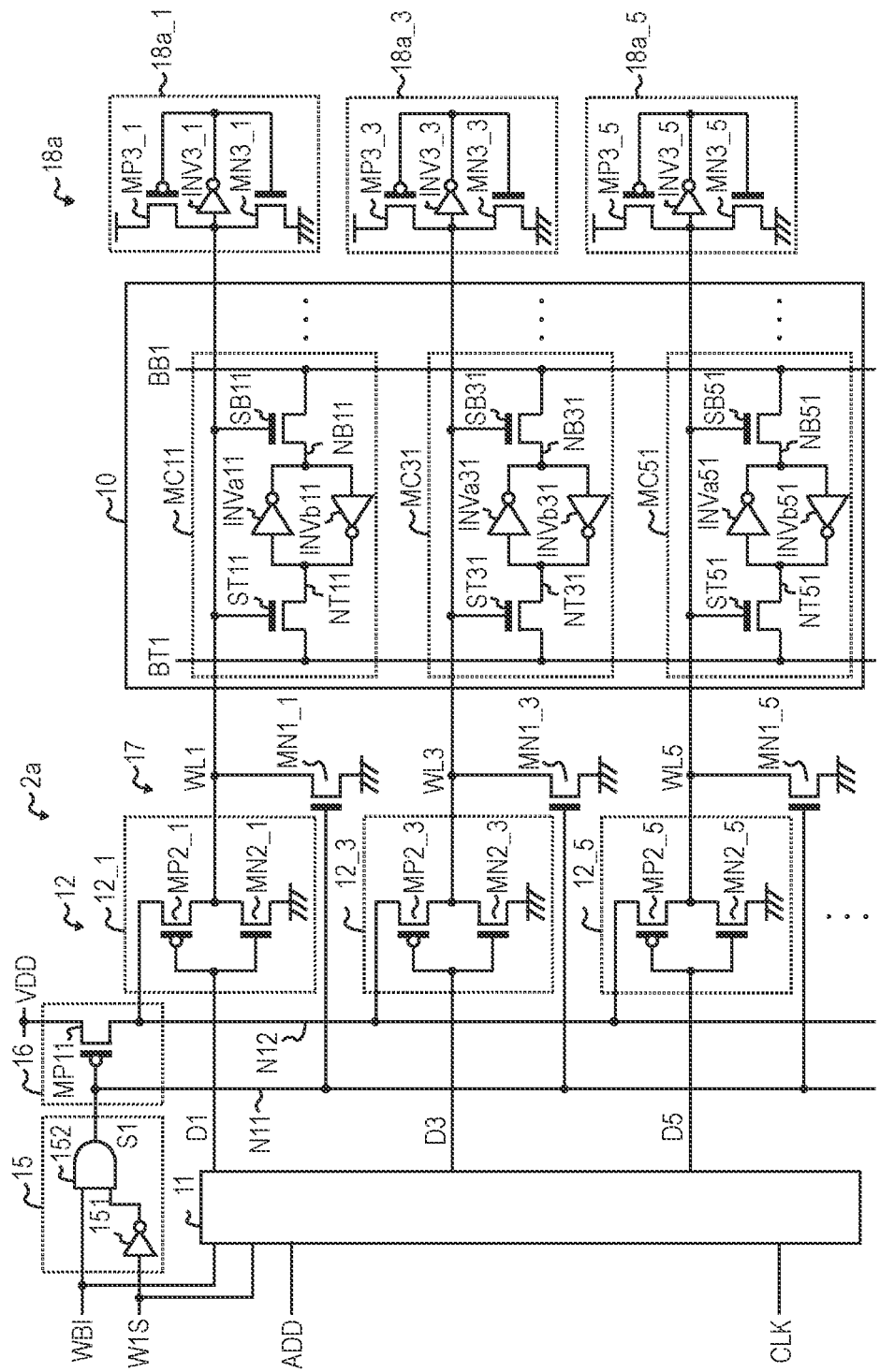
FIG. 9 is a circuit diagram showing a modification of the semiconductor memory device shown in FIG. 6.

FIG. 9 is a circuit diagram showing a modification of the semiconductor memory device 2 shown in FIG. 6 as a semiconductor memory device 2a. Note that FIG. 9 shows a part of a plurality of memory cells of odd-numbered rows and peripheral circuits thereof, as in the case of FIG. 6. Compared to the semiconductor memory device 2, the semiconductor memory device 2a includes an auxiliary circuit group 18a instead of the auxiliary circuit group 18.

The auxiliary circuit group 18a includes m auxiliary circuits 18a_1 to 18a_m corresponding to m word lines WL1 to WLm. Each of the auxiliary circuits 18a_1 to 18a_m includes an inverter, a P-channel MOS transistor, and an N-channel MOS transistor.

Specifically, any auxiliary circuit 18a_i among the auxiliary circuits 18a_1 to 18a_m includes an inverter INV3_i, a P-channel MOS transistor (hereinafter, simply referred to as a transistor) MP3_i, and an N-channel MOS transistor (hereinafter, simply referred to as a transistor) MN3_i. The input terminal of the inverter INV3_i is connected to the other end (far end) of the word line WLi, and the output terminal of the inverter INV3_i connected to the respective gates of the transistors MP3_i and MN3_i. The transistor MP3_i is provided between the power supply potential terminal VDD and the other end (far end) of the word line WLi, and is controlled to be in either an on state or an off state based on the output signal of the inverter INV3_i. The transistor MN3_i is provided between the reference potential terminal GND and the other end (far end) of the word line WLi, and is controlled to be in either an on state or an off state based on the output signal of the inverter INV3_i.

In the example of FIG. 9, the auxiliary circuit 18a_1 includes an inverter NV3_1, a transistor MP3_1, and a transistor MN3_1. Further, the auxiliary circuit 18a_3 includes an inverter INV3_3, a transistor MP3_3, and a transistor MN3_3. Further the auxiliary circuit 18_5 includes an inverter INV3_5, a transistor MP3_5, and a transistor MN3_5.

In the auxiliary circuit 18a_1, the output terminal of the inverter INV3_1 is connected to the respective gates of the transistors MP3_1 and MN3_1. The transistor MP3_1 is provided between the power supply potential terminal VDD and the other end of the word line WL1 and is controlled to be in either the on state or the off state based on the output signal of the inverter INV3_1. The transistor MN3_1 is provided between the reference potential terminal GND and the other end of the word line WL1 and is controlled to be in either the on state or the off state based on the output signal of the inverter INV3_1. In the auxiliary circuit 18a_3, the output terminal of the inverter INV3_3 is connected to the respective gates of the transistors MP3_3 and MN3_3. The transistor MP3_3 is provided between the power supply potential terminal VDD and the other end of the word line WL3 and is controlled to be in either the on state or the off state based on the output signal of the inverter INV3_3. The transistor MN3_3 is provided between the reference potential terminal GND and the other end of the word line WL3 and is controlled to be in either the on state or the off state based on the output signal of the inverter INV3_3. In the auxiliary circuit 18a_5, the output terminal of the inverter INV3_5 is connected to the respective gates of the transistors MP3_5 and MN3_5. The transistor MP3_5 is provided between the power supply potential terminal VDD and the other end of the word line WL5 and is controlled to be in either the on state or the off state based on the output signal of the inverter INV3_5. The transistor MN3_5 is provided between the reference potential terminal GND and the other end of the word line WL5 and is controlled to be in either the on state or the off state based on the output signal of the inverter INV3_5.

Since the other configurations of the semiconductor memory device 2a are the same as the configurations of the semiconductor memory device 2, the description thereof will be omitted.

As described above, the semiconductor memory device 2 according to the present embodiment can obtain the same effect as the semiconductor memory device 1. Further, the semiconductor memory device 2 according to the present embodiment uses the auxiliary circuits 18_1 to 18_m to reduce the difference between the transition times of the respective voltage levels at the near end side and the far end side of each word line, and as a result, it is possible to realize high-speed normal operation, and to apply appropriate stress to a plurality of memory cells at the time of burn-in test.

In the present embodiment, the case where the auxiliary circuits 18_1 to 18_m are connected to the far ends of the word lines WL1 to WLm, respectively, has been described as an example, but the present disclosure is not limited to this. For example, the auxiliary circuits 18_1 to 18_m may be provided near the central portion (other than the end) of the word lines WL1 to WLm, respectively. Further, the auxiliary circuits 18_1 to 18_m may be further provided near the central portion (other than the end) in addition to the far ends of the word lines WL1 to WLm, respectively.

Third Embodiment

Figure 10:
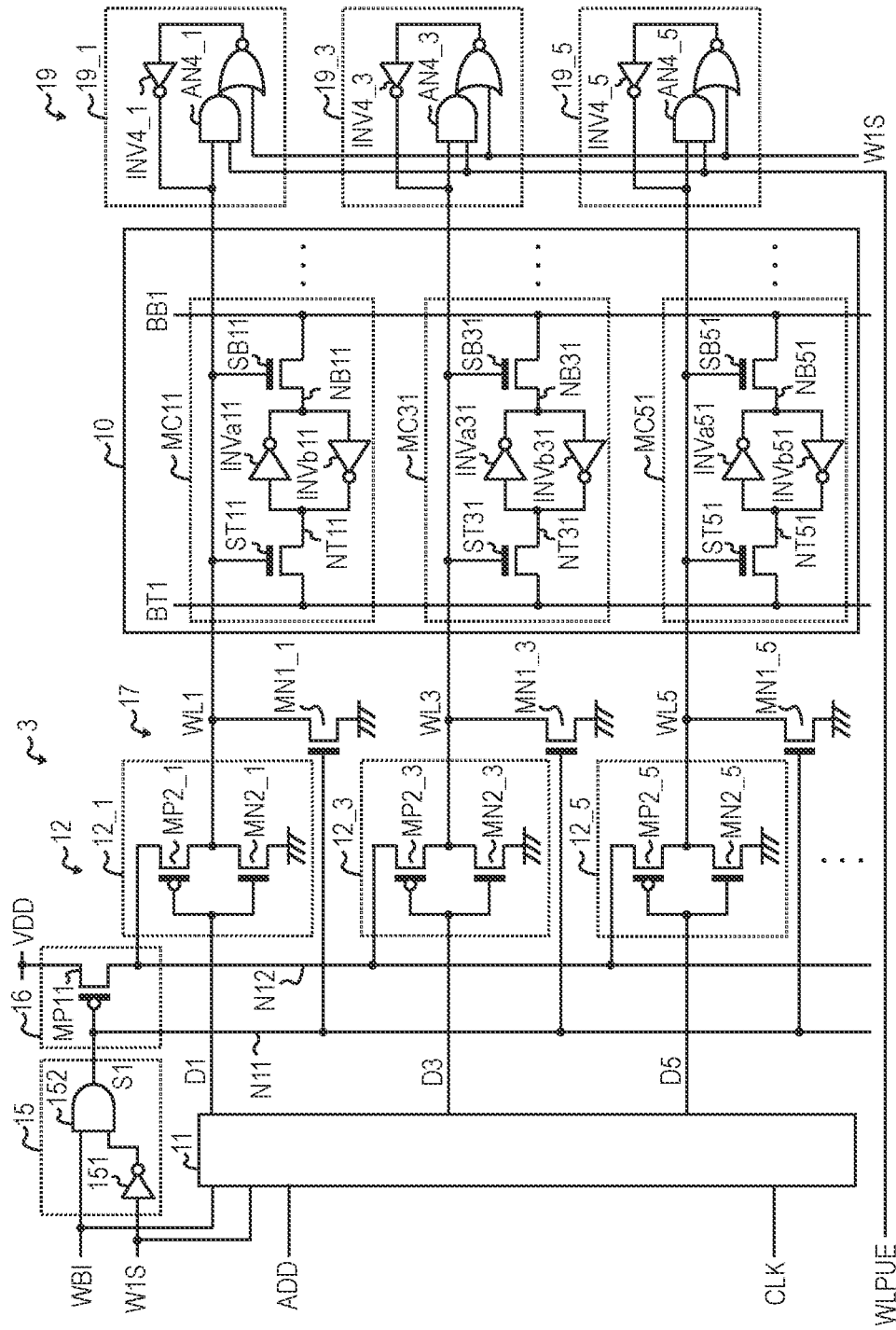
FIG. 10 is a circuit diagram showing specific configuration example of a part of a semiconductor memory device according to a third embodiment.

FIG. 10 is a circuit diagram showing a specific configuration example of a part of a plurality of memory cells of odd-numbered rows and peripheral circuits thereof in a semiconductor memory device 3 according to a third embodiment. Compared with the semiconductor memory device 2, the semiconductor memory device 3 includes an auxiliary circuit group 19 instead of the auxiliary circuit group 18. Other configurations of the semiconductor memory device 3 are the same as those of the semiconductor memory device 2.

The auxiliary circuit group 19 includes m auxiliary circuits 19_1 to 19_m corresponding to m word lines WL1 to WLm. The auxiliary circuits 19_1 to 19_m are connected to the far ends of the word lines WL1 to WLm, respectively.

Any auxiliary circuit 19_i among the auxiliary circuits 19_1 to 19_m includes a logic circuit AN4_i and an inverter 4_i. The inverter 4_i is configured to have a lower driving capability than the driving capability of the corresponding word line driver 12_i. The logic circuit AN4_i outputs a NOR operation result between an AND operation result between the signal at the far end of the word line WLi and a setting signal WLPUE, and the setting signal W1S. The inverter INV4_i outputs an inverted signal of the output signal of the logic circuit AN4_i to the far end of the word line WLi.

In the example of FIG. 10, an auxiliary circuit 19_1 includes a logic circuit AN4_1 and an inverter INV4_1. Further, an auxiliary circuit 19_3 includes a logic circuit AN4_3 and an inverter INV4_3. Further, an auxiliary circuit 19_5 includes a logic circuit AN4_5 and an inverter INV4_5.

In the auxiliary circuit 19_1, the logic circuit AN4_1 outputs a NOR operation result between an AND operation result between the signal at the far end of the word line WL1 and the setting signal WLPUE, and the setting signal W1S. The inverter INV4_1 outputs an inverted signal of the output signal of the logic circuit AN4_1 to the far end of the word line WL1. In the auxiliary circuit 19_3, the logic circuit AN4_3 outputs a NOR operation result between an AND operation result between the signal at the far end of the word line WL3 and the setting signal (first setting signal) WLPUE, and the setting signal (second setting signal) W1S. The inverter INV_3 outputs an inverted signal of the output signal of the logic circuit AN4_3 to the far end of the word line WL3. In the auxiliary circuit 19_5, the logic circuit AN4_5 outputs a NOR operation result between an AND operation result between the signal the far end of the word line WL5 and the setting signal WLPUE, and the setting signal W1S. The inverter INV4_5 outputs an inverted signal of the output signal of the logic circuit AN4_5 the far end of the word line WL5.

The Operation of the Semiconductor Memory Device 3

Figure 11:
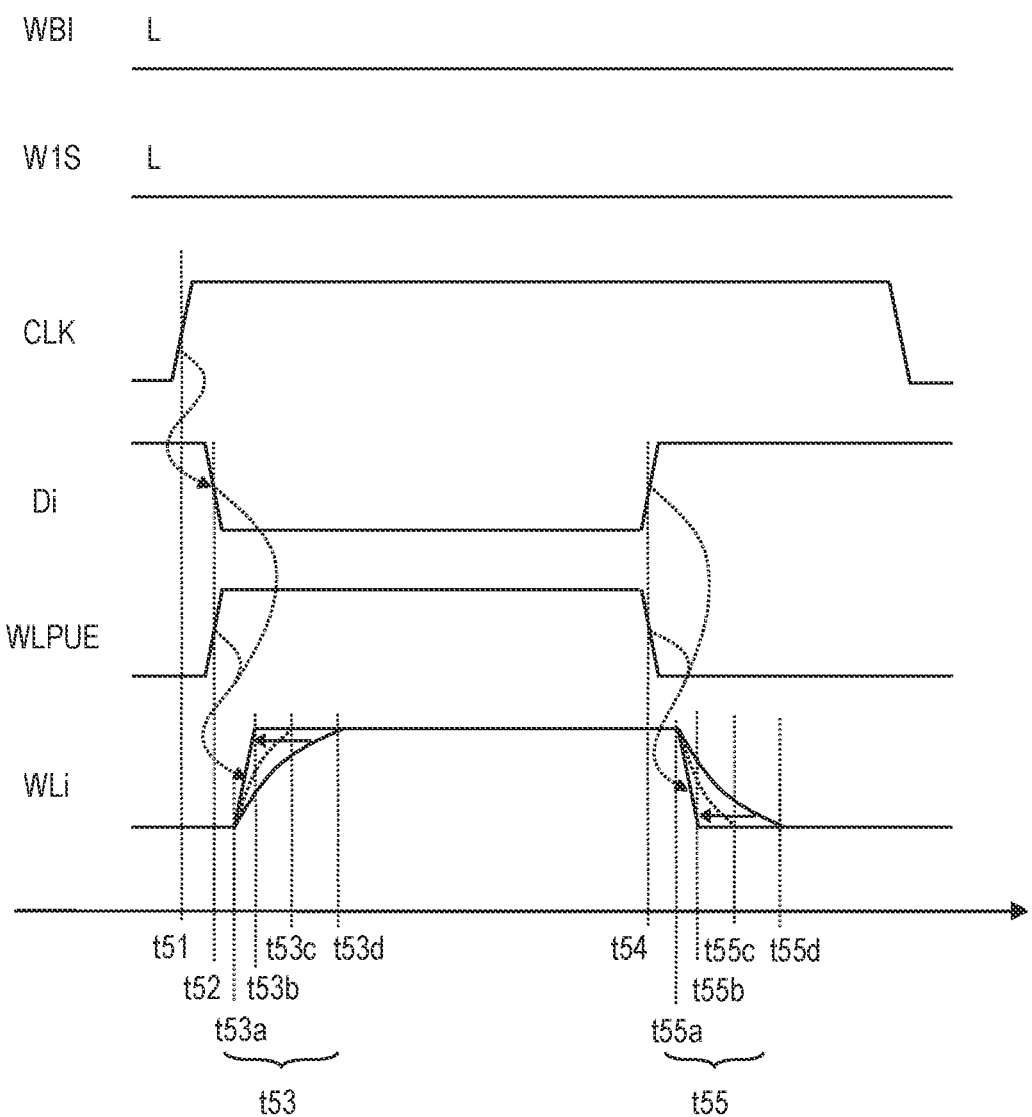
FIG. 11 is a timing chart showing an operation of the semiconductor memory device shown in FIG. 8 in a normal operation mode.
Figure 12:
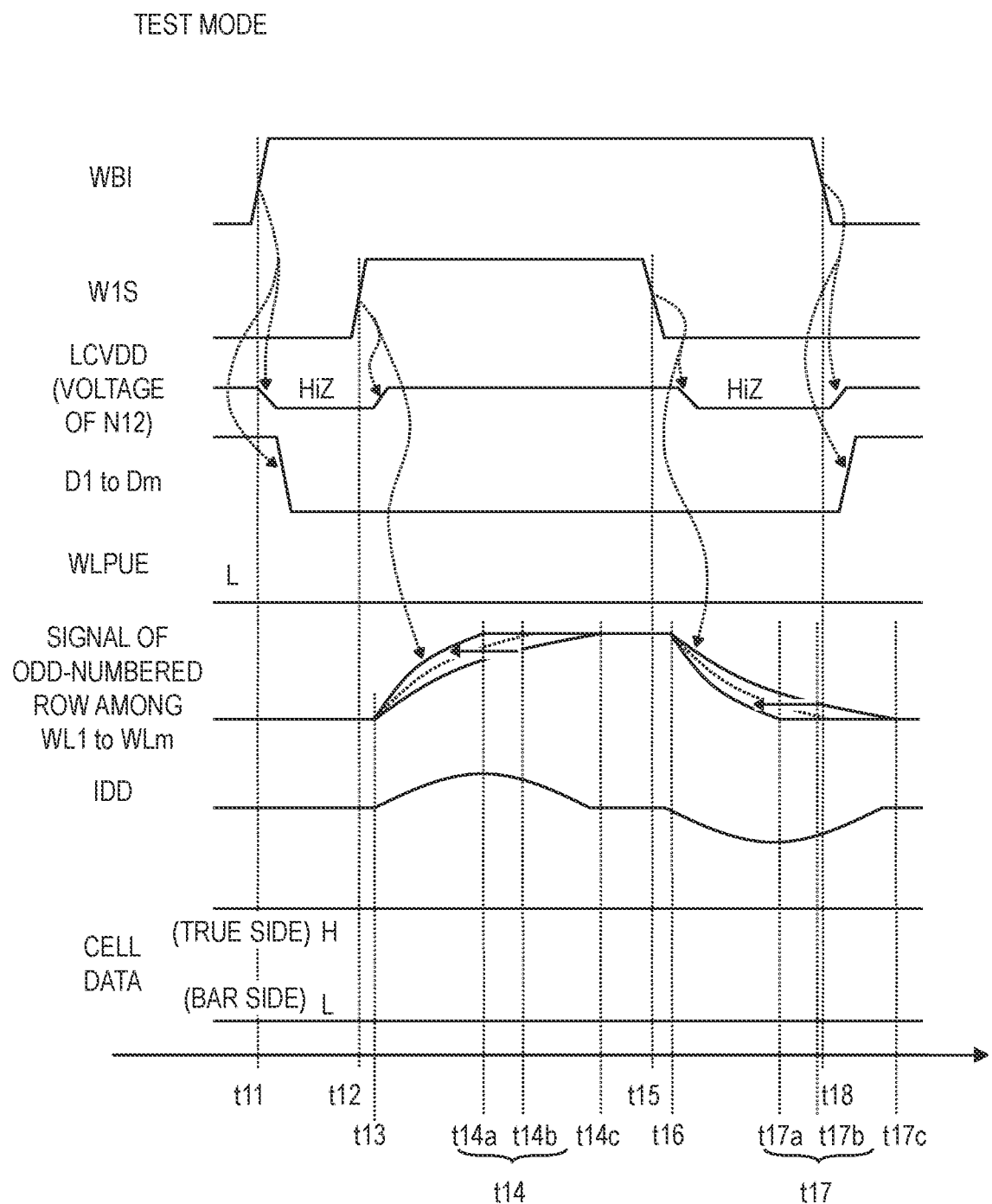
FIG. 12 is a timing chart showing an operation of the semiconductor memory device shown in FIG. 10 in a test mode.

Next, the operation of the semiconductor memory device 3 will be described with reference to FIGS. 11 and 12 in addition to FIG. 10. FIG. 11 is a timing chart showing the operation of the semiconductor memory device 3 in the normal operation mode. FIG. 12 is a timing chart showing the operation of the semiconductor memory device 3 in the test mode.

The Operation of the Semiconductor Memory Device 3 in the Normal Operation Mode First, the operation of the semiconductor memory device 3 in the normal operation mode will be described with reference mainly to FIG. 11. In the following, the contents different from the operations of the semiconductor memory device 2 among the operations of the semiconductor memory device 3 in the normal operation mode will be described.

In the semiconductor memory device 3, in synchronization with the rising edge of the clock signal CLK, the decode signal Di corresponding to the address specified by the address signal ADD falls and the setting signal WLPUE rises (at time t52). Thereby, in the word line WLi, not only the near end side is activated by the word line driver 12_i but also the far end side is activated by the auxiliary circuit 19_i.

Thus, the time (from time t53a to time 53b) required for the transition (solid line) of the voltage level at the far end side of the word line WLi from the L level to the H level is close (substantially the same) to the time (from time t53a to time t53b) required for the transition of the voltage level at the near end side of the word line WLi from the L level to the H level as compared with the time (from time t53a to time t53d) required for the transition (dashed line) when the auxiliary circuit 19_i is not provided. At this time, the difference between the time (from time t53a to time t53b) required for the transition (solid line) of each of the voltage levels at the near end side and the far end side of the word line WLi from the L level to the H level and the time (from time t53a to time t53c) required for the transition (broken line) of the voltage level at the central portion of the word line WLi from the L level to the H level also becomes small. Thus, for example, even when the number of memory cells is large and the word line length is very long, the semiconductor memory device 3 can reduce the difference between the transition times of the voltage levels at the near end side and the far end side of the word line, thereby realizing high-speed normal operation.

Similarly, in the semiconductor memory device 3, the decode signal Di rises and the setting signal WLPUE falls (at time t54). Thereby, in the word line WLi, not only the near end side is deactivated by the word line driver 12_i but also the far end side is deactivated by the auxiliary circuit 19_i.

Thus, the time (from time t55a to time t55b) required for the transition (solid line) of the voltage level at the far end side of the word line WLi from the H level to the level is close (substantially the same) to the time (from time t55a to time t55b) required for the transition (from time t55a to time t55d) of the voltage level at the near end side of the word line WLi from the H level to the L level as compared with the time (from time t55a to time t55d) required for the transition (dashed line) when the auxiliary circuit 19_i is not provided. At this time, the difference between the time (from time t55a to time t55b) required for the transition (solid line) of each of the voltage levels at the near end side and the far end side of the word line WLi from the H level to the L level and the time (from time t55a to time t55c) required for the transition (broken line) of the voltage level at the central portion of the word line WLi from the H level to the L level also becomes small. Thus, for example, even when the number of memory cells is large and the word line length is very long, the semiconductor memory device 3 can reduce the difference between the transition times of the voltage levels at the near end side and the far end side of the word line, thereby realizing high-speed normal operation.

The Operation of the Semiconductor Memory Device 3 in the Test Mode

Next, the operation of the semiconductor memory device 3 in the test mode will be described with reference mainly to FIGS. 10 and 12. In the following, the contents different from the operations of the semiconductor memory device 2 among the operations of the semiconductor memory device 3 in the test mode will be described.

In the test mode, the setting signal WLPUE is fixed to L level. Therefore, when the plurality of word lines of the odd-numbered rows among the word lines WL1 to WLm is activated in synchronization with the rising edge (at time t12) of the setting signal W1S, not only the near end side is activated by the plurality of word line drivers of the odd-numbered rows among the word line drivers 12_1 to 12_m, but also the far end side is activated by the plurality of auxiliary circuits of the odd-numbered rows among the auxiliary circuits 19_1 to 19_m, in the plurality of word lines of the odd-numbered rows.

Thus, the time (from time t13 to time t14a) required for the transition (solid line) of the voltage level at the far end side of the plurality of word lines of the odd-numbered rows from the L level to the H level is close (substantially the same) to the time (from time t13 to time t14a) required for the transition (from time t13 to time t14c) of the voltage level at the near end side of the plurality of word lines of the odd-numbered rows from the L level to the H level as compared with the time (from time t13 to time t14c) required for the transition (dashed line) when the auxiliary circuit is not provided. At this time, the difference between the time (from time t13 to time t14a) required for the transition (solid line) of each of the voltage levels at the near end side and the far end side of the plurality of word lines of the odd-numbered rows from the L level to the H level and the time (from time t13 to time t14b) required for the transition (broken line) of the voltage level at the central portion of the plurality of word lines of the odd-numbered rows from the L level to the H level also becomes small. As a result, for example, even when the number of memory cells is large and the word line length is very long, the semiconductor memory device 3 can reduce the difference in time for stressing the plurality of memory cells, and thus can apply more appropriate stress to the plurality memory cells.

Similarly, in the test mode, when the plural word lines of the odd-numbered rows among the word lines WL1 to WLm is deactivated in synchronization with the falling edge (at time t15) of the setting signal W1S, not only the near end side is deactivated by the plurality of word line drivers of the odd-numbered rows among the word line drivers 12_1 to 12_m, but also the far end side is deactivated by the plurality of auxiliary circuits of the odd-numbered rows among the auxiliary circuits 19_1 to 19_m, in the plurality of word lines of the odd-numbered rows.

Thus, the time (from time t16 to time t17a) required for the transition (solid line) of the voltage level at the far end side of the plurality of word lines of the odd-numbered rows to from the H level to the L level is close (substantially the same) to the time (from time t16 to time t17a) required for the transition of the voltage level at the near end side of the plurality of word lines of the odd-numbered rows from the H level to the L level as compared with the time (from time t16 to time t17c) required for the transition (dashed line) when the auxiliary circuit is not provided. At this time, the difference between the time (from time t16 to time t17a) required for the transition (solid line) of each of the voltage levels at the near end and the far end of the plurality of word lines of the odd-numbered rows from the H level to the L level and the time (from time t16 to time t17b) required for the transition (broken line) of the voltage level at the central portion of the plurality of word lines of the odd-numbered rows from the H level to the L level also becomes small. As a result, for example, even when the number of memory cells is large and the word line length is very long, the semiconductor memory device 3 can reduce the difference time for stressing the plurality of memory cells, and thus can apply more appropriate stress to the plurality of memory cells.

As described above, even when the number of memory cells is large and the word line length is very long, the semiconductor memory device 3 according to the present embodiment can obtain the same effect as the semiconductor memory device 2.

In the present embodiment, the case where the auxiliary circuits 19_1 to 19_m are connected to the far ends of the word lines WL1 to WLm, respectively, has been described as an example, but the present disclosure is not limited to this. For example, the auxiliary circuits 19_1 to 19_m may be provided near the central portion (other than the end) of the word lines WL1 to WLm, respectively. Further, the auxiliary circuits 19_1 to 19_m may be further provided near the central portion (other than the end) in addition to the far ends of the word lines WL1 to WLm, respectively.

Fourth Embodiment

Figure 13:
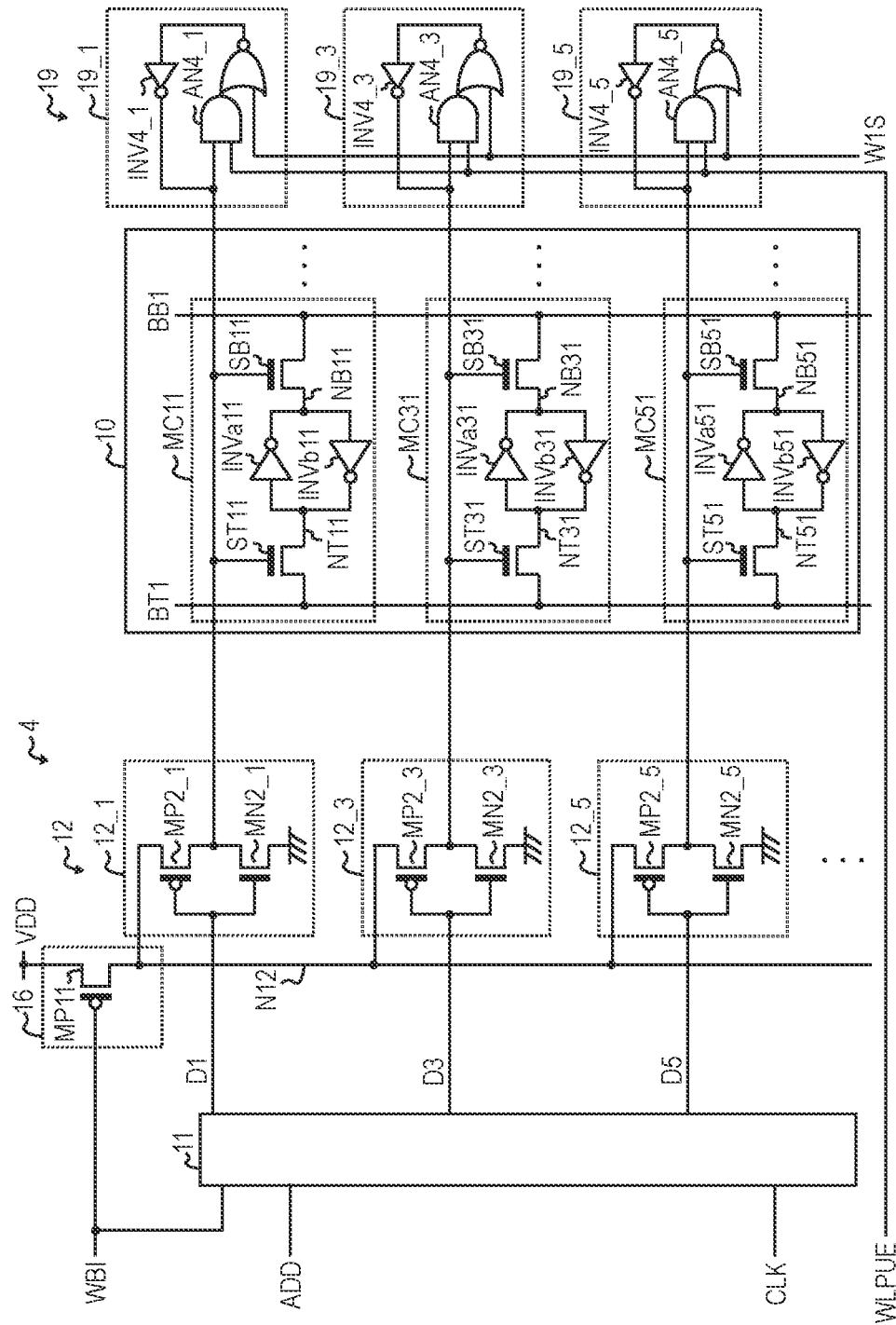
FIG. 13 is a circuit diagram showing a specific configuration example of a part of a semiconductor memory device according to a fourth embodiment.

FIG. 13 is a circuit diagram showing a specific configuration example of a part of a plurality of memory cells of odd-numbered rows and peripheral circuits thereof in a semiconductor memory device 4 according to a fourth embodiment. Compared with the semiconductor memory device 3, the semiconductor memory device 4 does not include the mode switching circuit 15 and the switch circuit group 17 (transistors MN1_1 to MN1_m).

Here, the transistor MP11 is controlled to be in either an on state or an off state based on the setting signal WBI instead of the control signal S1 output from the mode switching circuit 15. Specifically, the transistor MP11 is fixed to the on state by the setting signal WBI with the L level in the normal operation mode and is fixed to the off state by the setting signal WBI with the H level in the test mode. Thereby, the semiconductor memory device 4 drives the word lines WL1 to WLm using the word line driver group 12 and the auxiliary circuit group 19 in the normal operation mode and drives the word lines WL1 to WLm using only the auxiliary circuit group 19 in the test mode. Each of the inverters INV4_1 to INV4_m provided in the plurality of auxiliary circuits 19_1 to 19_m is configured to have a lower driving capability than that of each of the word line drivers 12_1 to 12_m. Other configurations of the semiconductor memory device 4 are the same as those of the semiconductor memory device 3.

The Operation of the Semiconductor Memory Device 4

Figure 14:
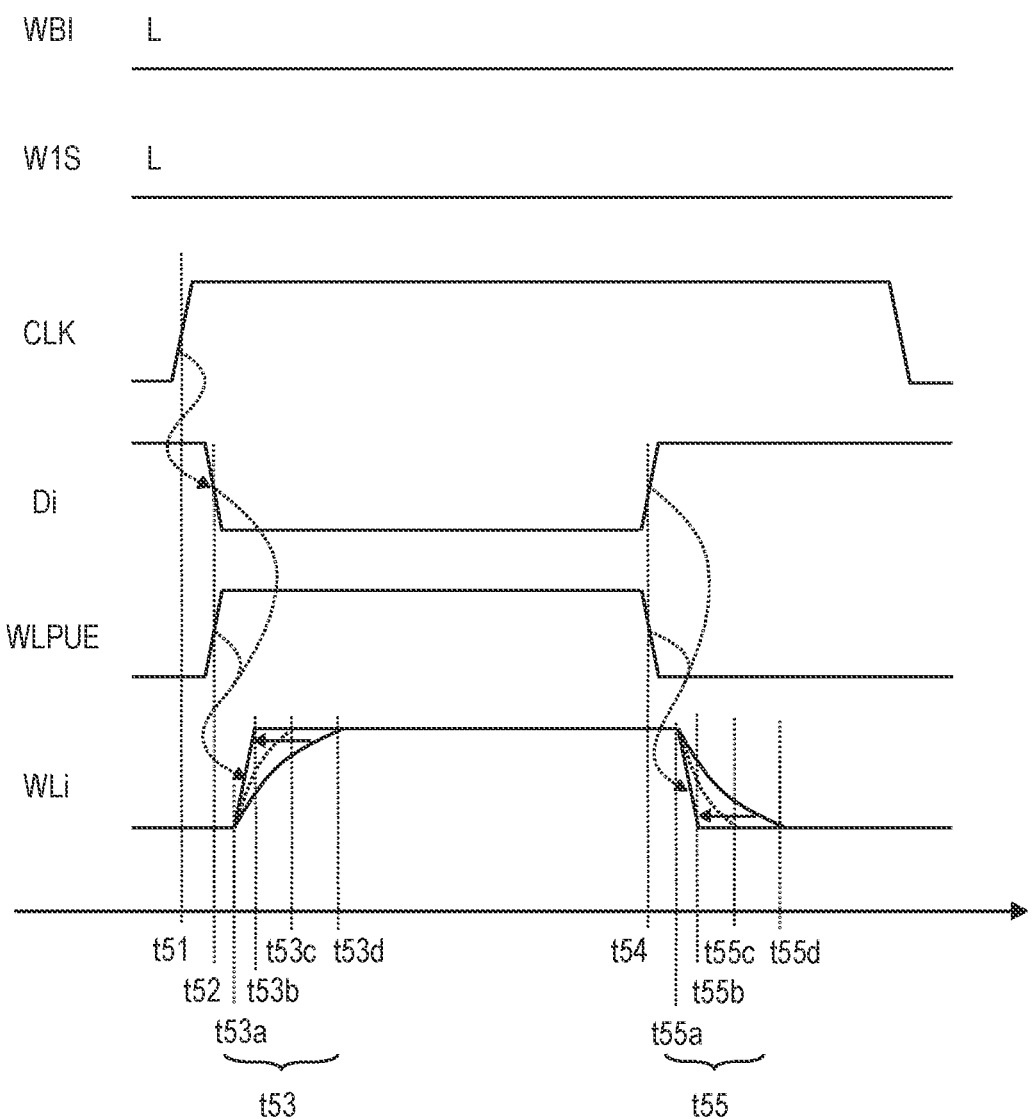
FIG. 14 is a timing chart showing an operation of the semiconductor memory device shown in FIG. 13 in a normal operation mode.
Figure 15:
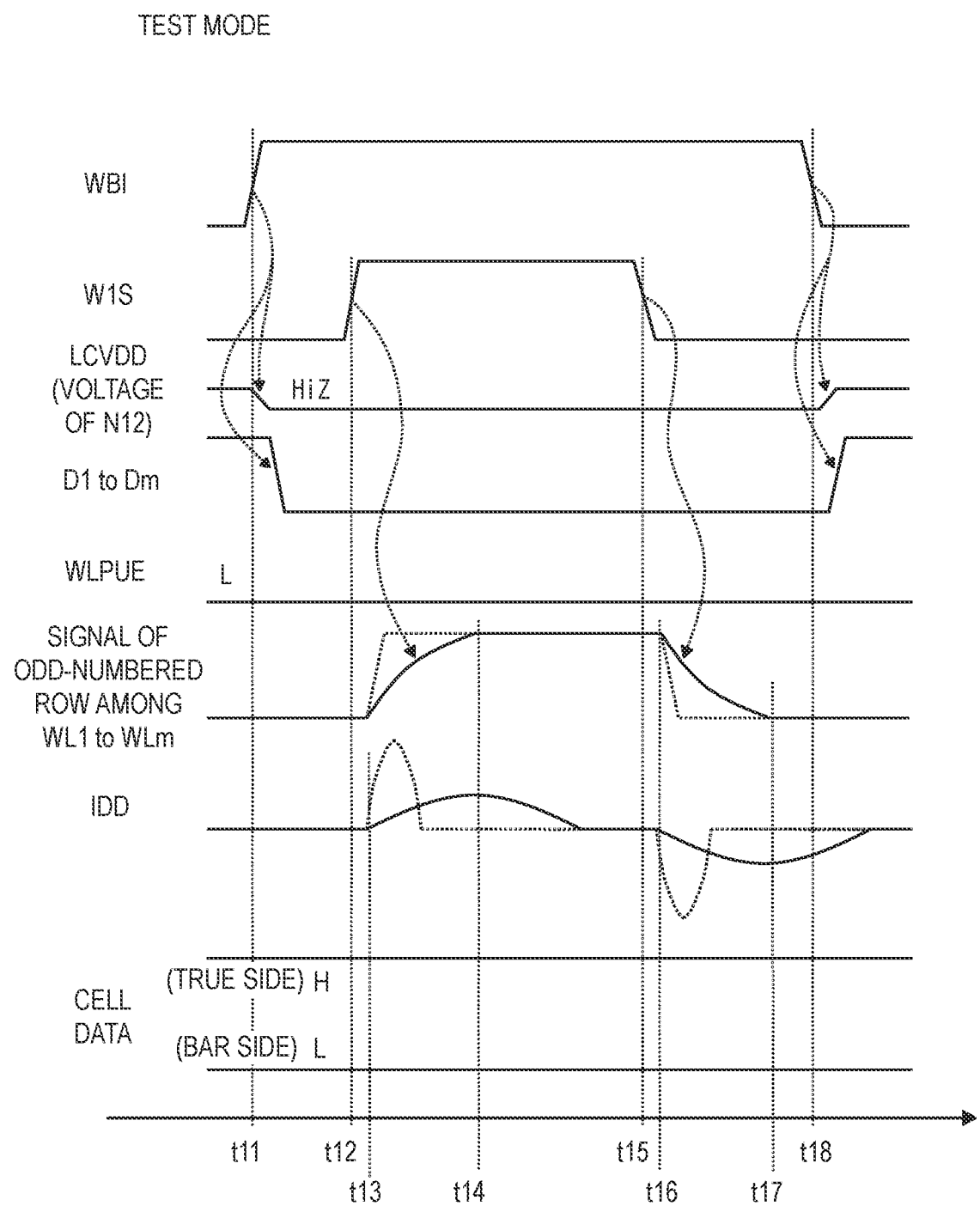
FIG. 15 is a timing chart showing an operation of the semiconductor memory device shown in FIG. 13 in a test mode.

Next, the operation of the semiconductor memory device 4 will be described with reference to FIGS. 14 and 15 in addition to FIG. 13. FIG. 14 is a timing chart showing the operation of the semiconductor memory device 4 in the normal operation mode. FIG. 15 is a timing chart showing the operation of the semiconductor memory device 4 in the test mode.

The Operation of the Semiconductor Memory Device 4 in the Normal Operation Mode

First, the operation of the semiconductor memory device 4 in the normal operation mode will be described with reference mainly to FIG. 14. The operation of the semiconductor memory device 4 in the normal operation mode is basically the same as that of the semiconductor memory device 3.

In the normal operation mode, the setting signal WBI is fixed to L level. Therefore, the transistor MP11 is constantly turned on.

In the semiconductor memory device 4, in synchronization with the rising edge of the clock signal CLK, the decode signal Di corresponding to the address specified by the address signal ADD falls and the setting signal WLPUE rises (at time t52). Thereby, in the word line WLi, not only the near end side is activated by the word line driver 12_i but also the far end side is activated by the auxiliary circuit 19_i.

Thus, the time (from time t53a to time t53b) required for the transition (solid line) of the voltage level at the far end side of the word line WLi from the L level to the H level is close (substantially the same) to the time (from time t53a to time t53b) required for the transition of the voltage level at the near end side of the word line WLi from the L level to the H level as compared with the time (from time t53a to time t53d) required for the transition (dashed line) when the auxiliary circuit 19i is not provided. At this time, the difference between the time (from time t53a to time t53b) required for the transition (solid line) of each of the voltage levels at the near end side and the far end side of the word line WLi from the L level to the H level and the time (from time t53a to time t53c) required for the transition (broken line) of the voltage level at the central portion of the word line WLi from the L level to the H level also becomes small. Thus, for example, even when the number of memory cells is large and the word line length is very long, the semiconductor memory device 4 can reduce the difference between the transition times of the voltage levels at the near end side and the far end side of the word line, thereby realizing high-speed normal operation.

Similarly, in the semiconductor memory device 4, the decode signal Di rises and the setting signal WLPUE falls (at time t54). Thereby, in the word line WLi, not only the near end side is deactivated by the word line driver 12_i but also the far end side is deactivated by the auxiliary circuit 19_i.

Thus, the time (from time t55a to time t55b) required for the transition (solid line) of the voltage level at the far end side of the word line WLi from the H level to the L level is close (substantially the same) to the time (from time t55a to time t55b) required for the transition of the voltage level at the near end side of the word line WLi from the H level to the L level as compared with the time (from time t55a to time t55d) required for the transition (dashed line) when the auxiliary circuit 19_i is not provided. At this time, the difference between the time (from time t55a to time t55b) required for the transition (solid line) of each of the voltage levels at the near end side and the far end side of the word line WLi from the H level to the L level and the time (from time t55a to time t55c) required for the transition (broken line) of the voltage level at the central portion of the word line WLi from the H level to the L level also becomes small. As a result, even when the number of memory cells is large and the word line length is very long, the semiconductor memory device 4 can reduce the difference between the transition times of the voltage levels at the near end side and the far end side of the word line, thereby realizing high-speed normal operation.

The Operation of the Semiconductor Memory Device 4 in the Test Mode

Next, the operation of the semiconductor memory device 4 in the test mode will be described with reference mainly to FIGS. 13 and 15. In the following, the contents different from the operations of the semiconductor memory device 3 among the operations of the semiconductor memory device 4 in the test mode will be described.

In test mode, the transistor MP11 is always turned off because the setting signal WBI is fixed to H level, Therefore, in the test mode, the word line driver group 12 do not drive the word lines WL1 to WLm. The word lines WL1 to WLm are driven by the auxiliary circuit group 19 instead of the word line driver group 12.

Specifically, in the test mode, the setting signal WLPUE is fixed to L level. Therefore, in synchronization with the rising edge (at time t12) of the setting signal W1S, the plurality of word lines of the odd-numbered rows among the word lines WL1 to WLm is activated by the plurality of auxiliary circuits of the odd-numbered rows among the auxiliary circuits 19_1 to 19_m.

Here, each of the inverters INV4_1 to INV4_m provided in the plurality of auxiliary circuits 19_1 to 19_m is configured to have a lower driving capability than that of each of the word line drivers 12_1 to 12_m.

Therefore, the time required for the transition (solid line) of the plurality of word line signals of the odd-numbered rows from the L level to the H level in the test mode becomes longer than the time required for the transition (broken line) of any word line signal from the L level to the H level in the normal operation mode (from time t13 to time t14). In other words, the slew rate of the rising edge of the plurality of word line signals of the odd-numbered rows in the test mode is slower than the slew rate of the rising edge of any word line signal in the normal operation mode. Thus, since the peak current IDD is suppressed and the voltage drop of the power supply potential line is suppressed, it is possible to prevent destruction of the cell data. As a result, the semiconductor memory device 4 can apply a desired stress to a plurality of memory cells to be tested in the test mode, and therefore, a highly reliable test can be performed.

Thereafter, the setting signal W1S transitions from the H level to the L level (at time t15). As a result, the plurality of word lines of odd-numbered rows among the word lines WL1 to WLm is deactivated by the plurality of auxiliary circuits of the odd-numbered rows among the auxiliary circuits 19_1 to 19_m.

Here, each of the inverters INV4_1 to INV4_m provided in the plurality of auxiliary circuits 19_1 to 19_m is configured to have a lower driving capability than that of each of the word line drivers 12_1 to 12_m.

Therefore, the time required for the transition (solid line) of the plurality of word line signals of the odd-numbered rows from the H level to the L level in the test mode becomes longer than the time required for the transition (broken line) of any word line signal from the H level to the level in the normal operation mode (from time t16 to time t17). In other words, the slew rate of the fall ng edge of the plurality of word line signals of the odd-numbered rows in the test mode is slower than the slew rate of the falling edge of any word line signal in the normal operation mode. Thus, since the peak current IDD is suppressed and the voltage rise (floating) of the reference potential line is suppressed, it is possible to prevent destruction of the cell data. As a result, the semiconductor memory device 4 can apply a desired stress to a plurality of memory cells to be tested in the test mode, and therefore, a highly reliable test can be performed.

As described above, in the semiconductor memory device 4 according to the present embodiment, during the burn-in test, the word lines of the plurality of rows are simultaneously activated and a desired stress is simultaneously applied to the memory cells of the plurality of rows, whereby shortening the test time. Further, the semiconductor memory device 4 according to the present embodiment suppresses the voltage drop of the power supply potential line and the voltage rise (floating) of the reference potential line by simultaneously activating or deactivating the word lines of the plurality of rows at a slew rate slower than the slew rate during the normal operation, and as a result, it is possible to perform the burn-in test with high reliability.

Although the invention made by the present inventor has been specifically described based on the embodiments, the present invention is not limited to the embodiments described above, and it is needless to say that various modifications can be made without departing from the gist thereof.

What is claimed is:

1. A semiconductor memory device which operates in an operation mode including a normal operation mode and a test mode, the semiconductor device comprising:
   a plurality of memory cells which is arranged in a matrix;
   a plurality of word lines which is coupled to the plurality of memory cells;
   a row address decoder which outputs a plurality of decode signals;
   a plurality of word line drivers which drives the plurality of word lines in response to the plurality of decode signals;
   a power supply potential terminal to which a power supply potential is supplied;
   a reference potential terminal to which a reference potential is supplied;
   a first switch transistor which is provided between the plurality of word line drivers and the power supply potential terminal, and whose conduction state is controlled in accordance with the operation mode; and
   a plurality of second switch transistors whose conduction state is controlled in accordance with the operation mode,
   wherein each of the plurality of word lines is wired for each row of the plurality memory cells, wherein each of the plurality of decode signals is output corresponding to the each of the plurality of word lines, wherein each of the plurality of word line drivers is coupled to the each of the plurality of word lines, drives the each of the plurality of word lines in response to the each of the plurality of decode signals, and includes an inverter that is configured by a P-channel Metal Oxide Semiconductor (MOS) transistor and an N-channel MOS transistor, wherein the first switch transistor is P-channel MOS transistor, wherein each of the plurality of second switch transistors is provided between the each of the plurality of word lines and the reference potential terminal, and is an N-channel MOS transistor, wherein the row address decoder activates all of decode signals corresponding to the plurality of memory cells to which a burn-in test is performed collectively in the test mode, wherein the first switch transistor has a lower driving capability than a total driving capability of two P-channel MOS transistors included in the inverters of two word line drivers among the plurality of the word line drivers, and wherein the each of the plurality of second switch transistors has a lower driving capability than a driving capability of the N-channel MOS transistor included in the inverter of the each of the plurality of word line drivers.

2. The semiconductor memory device according to claim 1, wherein the first switch transistor has substantially the same driving capability as the driving capability of the P-channel MOS transistor included in the inverter of the each of the plurality of word line drivers.

3. The semiconductor memory device according to claim 1, wherein, in the normal operation mode, the first switch transistor is controlled to be in an on state, and the plurality of second switch transistor is controlled to be in an off state.

4. The semiconductor memory device according to claim 1, wherein the test mode includes a first period, a second period and a third period, wherein, in the first period, the first switch transistor is controlled to be in an off state, and the plurality of second switch transistors is controlled to be in an on state, wherein, in the second period, the first switch transistor is controlled to be in an on state, and the plurality of second switch transistors is controlled to be in an off state, and wherein, in the third period, the first switch transistor is controlled to be in an off state, and the plurality of second switch transistors is controlled to be in an on state.

5. The semiconductor memory device according to claim 1, wherein the plurality of word line drivers is coupled to one end of the plurality of word lines, wherein the semiconductor memory device further comprises a plurality of first auxiliary circuits coupled to the other end of the plurality of word lines, and wherein each of the plurality of first auxiliary circuits is coupled to the other end of the each of the plurality of word lines and raises a potential of the other end to the power supply potential when the potential of the other end rises from the reference potential and reaches a first threshold potential.

6. The semiconductor memory device according to claim 5, wherein the each of the plurality of first auxiliary circuits comprises:

a first auxiliary transistor which is provided between the power supply potential terminal and the each of the plurality of word lines and which is a P-channel MOS transistor; and an auxiliary inverter which is coupled to the each of the plurality of word lines and the first auxiliary transistor, wherein an input of the auxiliary inverter is coupled to the each of the plurality of word lines, and wherein an output of the auxiliary inverter is coupled to a gate of the first auxiliary transistor.

7. The semiconductor memory device according to claim 6, wherein the each of the plurality of first auxiliary circuits lowers the potential of the other end to the reference potential when the potential of the other end drops from the power supply potential and reaches a second threshold potential.

8. The semiconductor memory device according to claim 7, wherein the each of the plurality of first auxiliary circuits further comprises a second auxiliary transistor which is provided between the reference potential terminal and the each of the plurality of word lines and which is an N-channel MOS transistor, and wherein the output of the auxiliary inverter is coupled to a gate of the second auxiliary transistor.

9. The semiconductor memory device according to claim 1, wherein the plurality of word line drivers is coupled to one end of the plurality of word lines, wherein the semiconductor memory device further comprises a plurality of first auxiliary circuits coupled so a central portion of the plurality of word lines, and wherein each of the plurality of first auxiliary circuits is coupled to the central portion of the each of the plurality of word lines and raises a potential of the central portion to the power supply potential when the potential of the central portion rises from the reference potential and reaches a first threshold potential.

10. The semiconductor memory device according to claim 9, wherein the each of the plurality of first auxiliary circuits lowers the potential of the central portion to the reference potential when the potential of the central portion drops from the power supply potential and reaches a second threshold potential.

11. The semiconductor memory device according to claim 1, wherein the plurality of word line drivers is coupled to one end of the plurality of word lines, wherein the semiconductor memory device further comprises a plurality of first auxiliary circuits coupled to the other end of the plurality of word lines, and wherein each of the plurality of first auxiliary circuits is coupled to the other end of the each of the plurality of word lines and raises a potential of the other and from the reference potential to the power supply potential in synchronization with a switching from an on state to an off state of the first switch transistor in the test mode.

12. The semiconductor memory device according to claim 11, wherein, in the normal operation mode, the each of the plurality of first auxiliary circuits:

raises the potential of the other end from the reference potential to the power supply potential in synchronization with activation of the each of the plurality of decode signals output corresponding to the each of the plurality of word lines coupled to the each of the plurality of first auxiliary circuits; and lowers the potential of the other end from the power supply potential to the reference potential in synchronization with deactivation of the each of the plurality of decode signals output corresponding to the each of the plurality of word lines coupled to the each of the plurality of first auxiliary circuits.

13. The semiconductor memory device according to claim 12, wherein the each of the plurality of first auxiliary circuits comprises:

an AND circuit which outputs a result of an AND operation between a word line signal output from the each of the plurality of word lines and a first setting signal;

a NOR circuit which outputs a result of a NOR operation between a second setting signal and an output signal of the AND circuit; and an auxiliary inverter which outputs an inverted signal of an output signal of the NOR circuit to the each of the plurality of word lines, wherein a logic value of the first setting signal is fixed to a level corresponding to the reference potential in the test mode, and changes in synchronization with a switching of activation and deactivation of the each of the plurality of decode signals in the normal operation mode, and wherein a logic value of the second setting signal is fixed to a level corresponding to the reference potential in the normal operation mode, and changes in synchronization with the switching from the on state to the off state of the first switch transistor in the test mode.

14. The semiconductor memory device according to claim 1, wherein the semiconductor memory device is a Static Random Access Memory (SRAM).

15. A test method for the semiconductor memory device according to claim 1, the test method comprising the steps of:

lowering a potential of the plurality of word lines to the reference potential by turning off the first switch transistor and turning on the plurality of second switch transistor, after the step of lowering, using the row address decoder to activate all of the decode signals corresponding to the plurality of memory cells to which the burn-in test is collectively performed; and after the step of using, raising the potential of the plurality of word lines to the power supply potential by switching the conduction state of the first switch transistor from an off state to an on state and switching the conduction state of the plurality of second switch transistors from an on state to an off state.

16. The test method for the semiconductor memory device according to claim 15, the test method further comprising the step of writing same data to all of the plurality of memory cells to which the burn-in test is collectively performed, before the step of lowering.

17. The test method for the semiconductor memory device according to claim 15, the test method further comprising the step of lowering the potential of the plurality of word lines to the reference potential by switching the conduction state of the first switch transistor from the on state to the off state and switching the conduction state of the plurality of second switch transistors from the off state to the on state, after the step of raising.

* * * * *